United States Patent
Song et al.

(10) Patent No.: US 8,502,084 B2
(45) Date of Patent: Aug. 6, 2013

(54) SEMICONDUCTOR PACKAGE INCLUDING POWER BALL MATRIX AND POWER RING HAVING IMPROVED POWER INTEGRITY

(75) Inventors: Eun seok Song, Hwaseong-si (KR); Hee seok Lee, Yongin-si (KR); Hyun-a Kim, Hwaseong-si (KR); So-young Lim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 436 days.

(21) Appl. No.: 12/772,385

(22) Filed: May 3, 2010

(65) Prior Publication Data

US 2010/0276189 A1 Nov. 4, 2010

(30) Foreign Application Priority Data

May 1, 2009 (KR) ........................ 10-2009-0038735

(51) Int. Cl.
*H05K 1/11* (2006.01)
(52) U.S. Cl.
USPC ............................ 174/262; 174/260; 174/261
(58) Field of Classification Search
None
See application file for complete search history.

(56) References Cited

U.S. PATENT DOCUMENTS

| | | | | |
|---|---|---|---|---|
| 5,672,911 | A | * | 9/1997 | Patil et al. ...................... 257/691 |
| 6,399,991 | B1 | | 6/2002 | Ando |
| 6,479,758 | B1 | * | 11/2002 | Arima et al. ................... 174/260 |
| 6,528,872 | B2 | | 3/2003 | Chang |
| 7,489,519 | B1 | * | 2/2009 | Nishi et al. ..................... 361/772 |
| 7,687,898 | B2 | * | 3/2010 | Hung et al. ..................... 257/686 |
| 2003/0201528 | A1 | | 10/2003 | Hsu |
| 2008/0290495 | A1 | * | 11/2008 | Uematsu et al. ............... 257/691 |

* cited by examiner

*Primary Examiner* — Ishwarbhai Patel
(74) *Attorney, Agent, or Firm* — Onello & Mello, LLP

(57) ABSTRACT

A semiconductor chip carrier having multiple conductive layers separated from each other by dielectric layers, a chip bonding position at an intermediate portion of a top surface of the semiconductor chip carrier, and a bonding region spaced apart from the chip bonding position. The bonding region includes a first bonding region closest to the chip bonding position, a second bonding region most distant from the chip bonding position, and a third bonding region positioned between the first bonding region and the second bonding region. The first bonding region, the second bonding region and the third bonding region are electrically insulated from each other and the first bonding region is configured to carry a first voltage, the second bonding region is configured to carry a second voltage and the third bonding region is configured to carry a third voltage that is less than the first voltage and less than the second voltage.

26 Claims, 28 Drawing Sheets

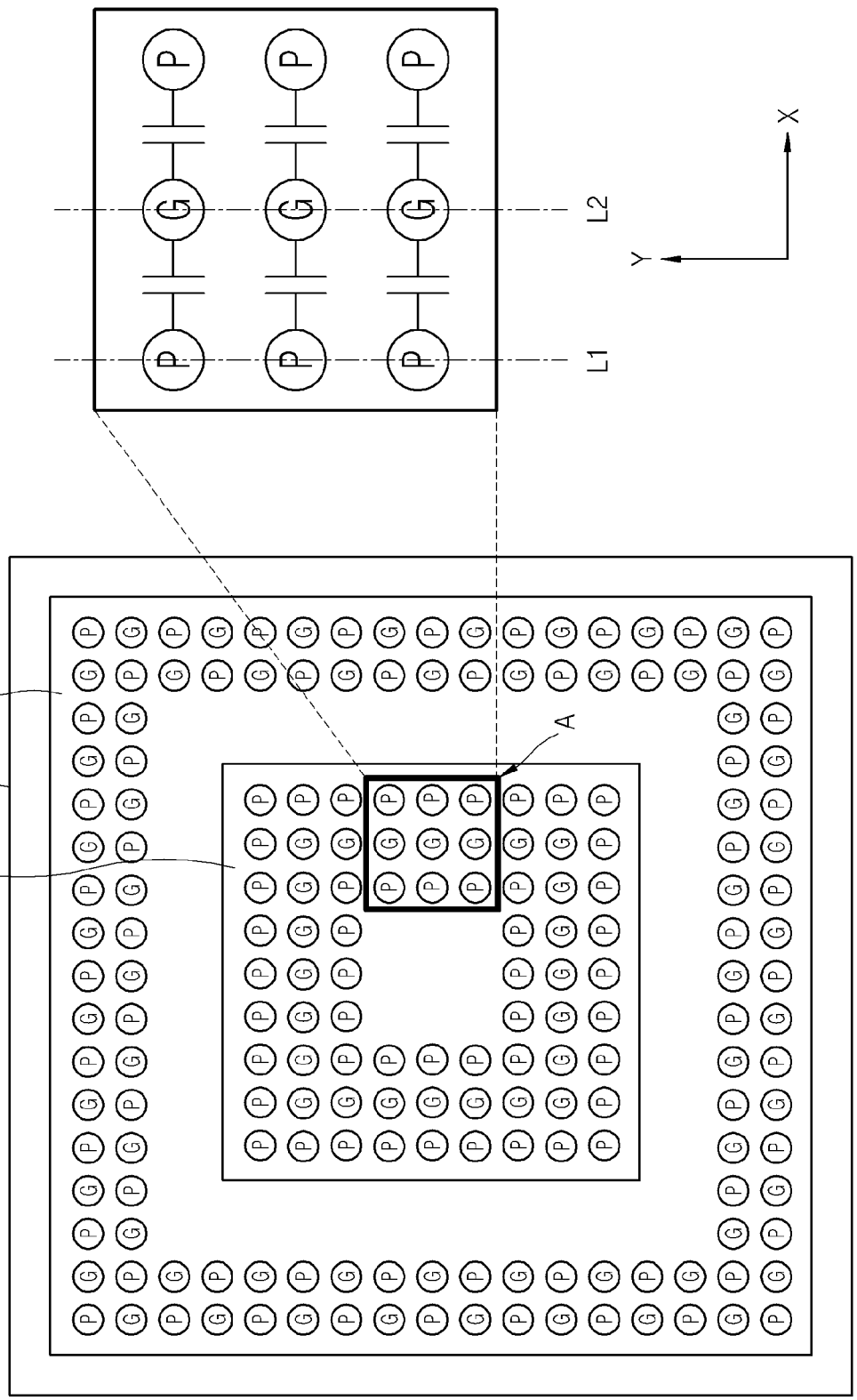

1

SEMICONDUCTOR PACKAGE INCLUDING POWER BALL MATRIX AND POWER RING HAVING IMPROVED POWER INTEGRITY

RELATED APPLICATIONS

This application claims priority under 35 U.S.C. 119 to Korean Patent Application No 10-2009-0038735, filed on May 1, 2009, the content of which is incorporated herein by reference in its entirety.

BACKGROUND

With the continued emphasis on highly integrated electronic devices, there is an ongoing need for semiconductor memory devices that operate at higher speed and lower power and have increased device density. To accomplish this, devices with aggressive scaling and multiple-layered devices with transistor cells arranged in horizontal and vertical arrays have been under development. As a result of such increased device density, there is a continuing need for device packages that can support increased device pinout and can support signal transfer at ever-faster exchange rates.

A typical semiconductor device comprises a semiconductor chip, or integrated circuit, that is mounted to a multiple-layered package substrate. The chip is bonded to the substrate using wire bonding, or recently, using flip-chip bonding. Package leads in the form of wire leads or ball matrix leads provide an interface between the chip package and external circuitry. Power signals, ground signals, data signals and control signals are routed between the chip and the package leads via the wire/flip-chip bonding interface and via the package substrate.

With increased device density and increased operating frequencies, a number of problems can be introduced by the semiconductor device package, including crosstalk between neighboring wire/flip-chip bonding interfaces and between neighboring layers of the substrate. As devices continue to become reduced in size due to further integration, there is an increased likelihood of interference in the device package during operation, which can lead to reduced device reliability.

SUMMARY

Embodiments of the present inventive concept are directed to systems and methods that address and overcome the limitations of the conventional methods. Further, embodiments of the present invention are directed to a semiconductor package configuration that provides enhanced isolation between bonding regions of the substrate, and offering enhanced capacitance between power planes of the substrate. As a result, interference and crosstalk between voltage signals during high-frequency operation is mitigated or eliminated.

In one aspect, embodiments of the inventive concepts are directed to a semiconductor chip carrier, comprising: multiple conductive layers separated from each other by dielectric layers; a chip bonding position at an intermediate portion of a top surface of the semiconductor chip carrier; and a bonding region spaced apart from the chip bonding position, the bonding region being positioned on an upper conductive layer of the multiple conductive layers. The bonding region comprises: a first bonding region closest to the chip bonding position; a second bonding region most distant from the chip bonding position; and a third bonding region positioned between the first bonding region and the second bonding region. The first bonding region, the second bonding region and the third bonding region are electrically insulated from each other and the first bonding region is configured to carry a first voltage, the second bonding region is configured to carry a second voltage and the third bonding region is configured to carry a third voltage that is less than the first voltage and less than the second voltage.

In one embodiment, the first voltage comprises an internal voltage level, the second voltage comprises an external voltage level, and the third voltage comprises a ground reference level.

In another embodiment, a lower conductive layer of the multiple conductive layers comprises a plurality of package lead bonding regions.

In another embodiment, a second conductive layer neighboring the upper conductive layer in a vertical direction of the chip carrier comprises a conductive plane that is configured to carry the third voltage; and a third conductive layer neighboring the second conductive layer opposite the upper conductive layer in the vertical direction comprises a conductive plane that is configured to carry at least one of the first and second voltages.

In another embodiment, the semiconductor chip carrier further comprises first conductive vias that pass through the second conductive layer and are electrically insulated from the second conductive layer that are configured to carry at least one of the first voltage and the second voltage from the third conductive layer to the upper conductive layer.

In another embodiment, a fourth conductive layer neighboring the third conductive layer opposite the second conductive layer in the vertical direction comprises a conductive plane that is configured to carry the third voltage.

In another embodiment, the semiconductor chip carrier further comprises second conductive vias that pass through the third conductive layer and are electrically insulated from the third conductive layer that are configured to carry the third voltage from the fourth conductive layer to the second conductive layer.

In another embodiment, the fourth conductive layer comprises a lowermost conductive layer of the multiple conductive layers, the lowermost conductive layer comprising a plurality of package lead bonding regions.

In another embodiment, the second conductive layer comprises first and second portions that are electrically insulated from each other, and the first portion is configured to carry the third voltage and wherein the second portion is configured to carry a fourth voltage, wherein the third voltage is less than the fourth voltage.

In another embodiment, the semiconductor chip carrier further comprises a plurality of signal bonding regions positioned on the upper conductive layer, the signal bonding regions being more distant from the chip bonding position than the second bonding region.

In another embodiment, the semiconductor chip carrier further comprises a wire-bond-type semiconductor chip mounted at the chip bonding position and further comprises: first bonding wires connecting first chip bonding pads of the semiconductor chip to the first bonding region; second bonding wires connecting second chip bonding pads of the semiconductor chip to the second bonding region; and third bonding wires connecting third chip bonding pads of the semiconductor chip to the third bonding region; wherein the third bonding wires are positioned between the first bonding wires and the second bonding wires.

In another embodiment, the third bonding wires operate as a signal interference shield between the first voltage present on the first bonding wires and the second voltage present on the second bonding wires.

In another embodiment, a lower conductive layer of the multiple conductive layers comprises a plurality of package lead bonding regions, wherein: a first set of the package lead bonding regions are coupled to the first bonding region; a second set of the package lead bonding regions are coupled to the second bonding region; a third set of the package lead bonding regions are coupled to the third bonding region; wherein the third set of the package lead bonding regions are positioned between the first set of the package lead bonding regions and the second set of the package lead bonding regions.

In another embodiment, the first bonding region covers the chip bonding position so that an underside of a chip mounted to the semiconductor chip carrier makes electrical contact with the first bonding region.

In another embodiment, at least one of the first bonding region, the second bonding region and the third bonding region has an exposed upper surface that comprises a conductive ring that surrounds the chip bonding position.

In another embodiment, at least one of the first bonding region, the second bonding region and the third bonding region is recessed relative to the top surface of the semiconductor chip carrier.

In another embodiment, at least one of the first bonding region, the second bonding region and the third bonding region has a top surface that comprises a segmented conductive ring that surrounds the chip bonding position.

In another embodiment, at least one of the first bonding region, the second bonding region and the third bonding region has a top surface that comprises a conductive segment that lies at one or more sides of the chip bonding position, but does not surround the chip bonding position.

In another embodiment, at least one of the first bonding region, the second bonding region and the third bonding region has a top surface that comprises discrete conductive segments that each provide a single bonding location for bonding a chip to the semiconductor chip carrier.

In another embodiment, the discrete conductive segments of the at least one bonding region include a first set of conductive segments and a second set of conductive segments, that are horizontally offset from each other, relative to the chip bonding position.

In another embodiment, at least one of the first bonding region, the second bonding region and the third bonding region extends in a linear direction.

In another embodiment, at least one of the first bonding region, the second bonding region and the third bonding region extends along a curved direction.

In another aspect of the present inventive concepts, a semiconductor chip carrier comprises: multiple conductive layers separated from each other by dielectric layers. The multiple conductive layers in turn comprise: a first conductive layer having a chip bonding position and bonding regions, the bonding regions comprising a first bonding region, a second bonding region, and a third bonding region electrically insulated from each other; wherein the first bonding region is closest in proximity among the bonding regions to a center of the chip bonding position, the second bonding region is more distant from the chip bonding position than the first bonding region, and the third bonding region is more distant from the chip bonding position than the second bonding region; and wherein the first bonding region is configured to carry a first voltage, the second bonding region is configured to carry a second voltage, and the third bonding region is configured to carry a third voltage; a second conductive layer neighboring the first conductive layer in a vertical direction of the chip carrier, the second conductive layer configured to carry the second voltage; a third conductive layer neighboring the second conductive layer opposite the first conductive layer in the vertical direction, the third conductive layer configured to carry the third voltage; and a fourth conductive layer neighboring the third conductive layer opposite the second conductive layer in the vertical direction, the fourth conductive layer configured to carry the second voltage.

In one embodiment, the first voltage is a first power voltage, the second voltage is a ground voltage, and the third voltage is a second power voltage.

In another embodiment, the first conductive layer further comprises a power plane.

In another embodiment, the second conductive layer further comprises a ground plane.

In another embodiment, the third conductive layer further comprises at least a power plane.

In another embodiment, the fourth conductive layer further comprises lead pads comprising a first lead pad, a second lead pad, and a third lead pad electrically insulated from each other; wherein the first lead pad is closest in proximity among the lead pads to a corresponding position on the fourth conductive layer that corresponds, in the vertical direction, to a center of the chip bonding position, the second lead pad is more distant from the corresponding position on the fourth conductive layer than the first lead pad, and the third lead pad is more distant from the corresponding position on the fourth conductive layer than the second lead pad; and wherein the first lead pad is configured to carry the first voltage, the second lead pad is configured to carry the second voltage, and the third lead pad is configured to carry the third voltage

BRIEF DESCRIPTION OF THE DRAWINGS

The foregoing and other objects, features and advantages of the embodiments of the invention will be apparent from the more particular description of preferred embodiments of the inventive concept, as illustrated in the accompanying drawings in which like reference characters refer to the same parts throughout the different views. The drawings are not necessarily to scale, emphasis instead being placed upon illustrating the principles of the inventive concept. In the drawings:

FIG. 11A-11D illustrate various embodiments of the package lead pad matrix, in accordance with the present inventive concepts

DETAILED DESCRIPTION OF EMBODIMENTS

Embodiments of the present inventive concept will now be described more fully hereinafter with reference to the accompanying drawings, in which preferred embodiments of the invention are shown. This invention may, however, be embodied in different forms and should not be construed as limited to the embodiments set forth herein. Like numbers refer to like elements throughout the specification.

It will be understood that, although the terms "first", "second", etc. are used herein to describe various elements, these elements should not be limited by these terms. These terms are used to distinguish one element from another. For example, a "first" element could be termed a "second" element, and, similarly, a "second" element could be termed a "first" element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.). When an element is referred to herein as being "over" another element, it can be over or under the other element, and either directly coupled to the other element, or intervening elements may be present, or the elements may be spaced apart by a void or gap.

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Figure 1:
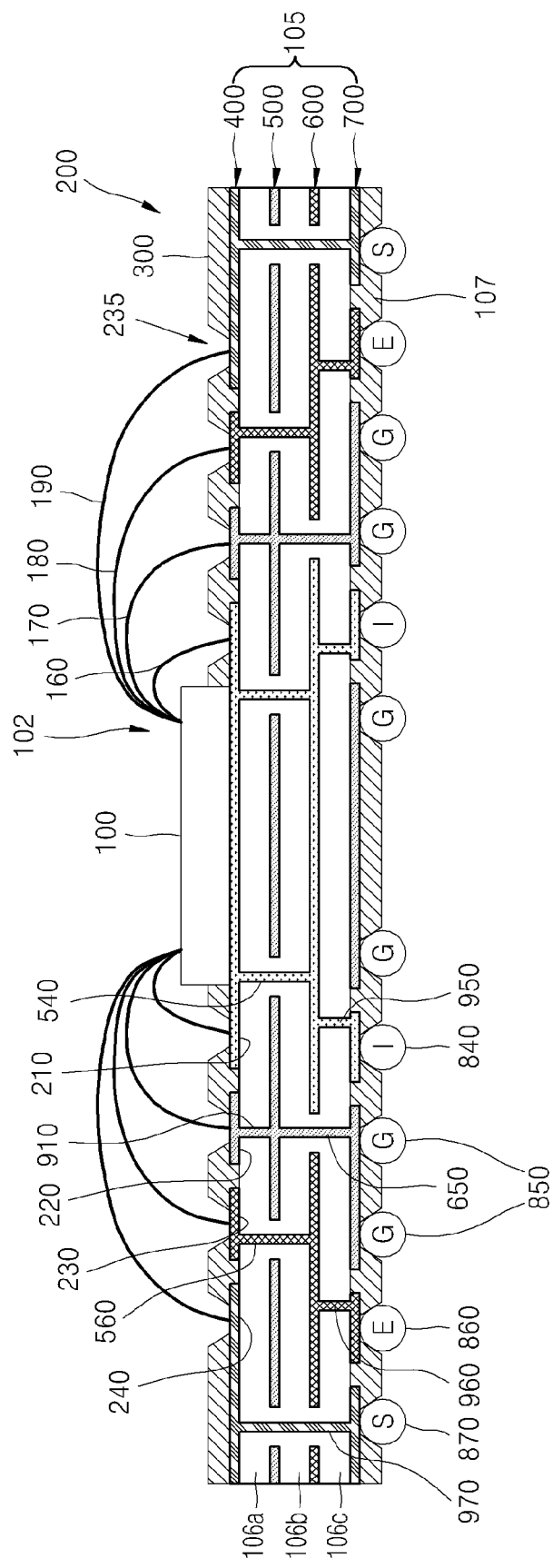
FIG. 1 is a cross-sectional diagram of a device package in accordance with an embodiment of the present inventive concepts.

FIG. 1 is a cross-sectional diagram of a device package in accordance with an embodiment of the present inventive concepts. The cross-section of FIG. 1 is taken, for example, across section line B-B' of FIG. 3A or 3B. A device package typically includes a semiconductor chip 100 that is bonded to a substrate 200. The substrate 200 is often referred to as a "Printed Circuit Board" (PCB). The substrate 200 commonly includes multiple conductive layers 105 that route power signals, ground signals, data signals, and control signals between package leads 840, 850, 860, 870 and substrate bonding pads 210, 220, 230, 240. The multiple conductive layers 105 of the substrate 200 are electrically insulated from each other by insulative layers 106a, 106b, 106c and signal pathways are routed in vertical and horizontal directions through the insulative layers 106a, 106b, 106c to provide an interconnect for the signals. In this example, the multiple conductive layers 105 include first through fourth conductive layers 400, 500, 600, 700. A layer of solder resist 300 may be disposed on the first conductive layer 400 and may expose the bonding pads 210, 220, 230, 240 at openings 235. In this example, first vertical interconnects 540, 950 connect first substrate bonding pads 210 to first package leads 840, second vertical interconnects 560, 960 connect second substrate bonding pads 230 to second package leads 860, third vertical interconnects 650, 910 connect third substrate bonding pads 220 to third package leads 850, and fourth vertical interconnects 970 connect fourth substrate bonding pad 240 to fourth package leads 870.

Contemporary semiconductor chips require a plurality of voltage levels for proper operation. These can include a ground level, or VSS, an internal power level, or VDDI, and an external power level, or VDDE. In an example embodiment, VSS can have a voltage level of 0 V, VDDI can have a voltage level of 1.2 V and VDDE can have a voltage level of 1.8 V or 3.3 V. Other voltage levels for GND, VDDI and VDDE are equally applicable to the present inventive concepts.

The substrate bonding pads 210, 220, 230, 240 can be formed of a top, or first, conductive layer 400 of the substrate 200. As shown in FIGS. 1, 3A, 3B and 3E through 3I, bonding wires 160, 170, 180, 190 can be used to connect chip bonding pads 102 of the chip 100 to the substrate bonding pads 210, 220, 230, 240 according to wire bonding techniques. In one embodiment, the substrate bonding pads 210, 220, 230, used for power and ground signals can each comprise a plurality of discrete pads that are separated from each other in a horizontal direction. In another embodiment, the substrate bonding pads 210, 220, 230 used for power and ground signals transfer can each comprise regions that extend in a horizontal direction and are generally linear in shape. In some embodiments, the regions can be segmented about the perimeter of the chip 100. In other embodiments, the segments can be parallel to one or more edges of the chip 100 and not surround the entire perimeter. In other embodiments, the regions can be joined to form rings that connect to surround the chip 100. The term "bonding pads", as used herein in connection with the substrate bonding pads, and, in particular, the substrate bonding pads used for power transfer 210, 220, 230, is used herein to include all of the types of substrate bonding pad configurations including discrete bonding pads, bonding pad regions, segmented bonding pad regions, ring-shaped bonding pad regions, linear-shaped bonding pad regions and non-linear-shaped bonding pad regions.

Figure 2:
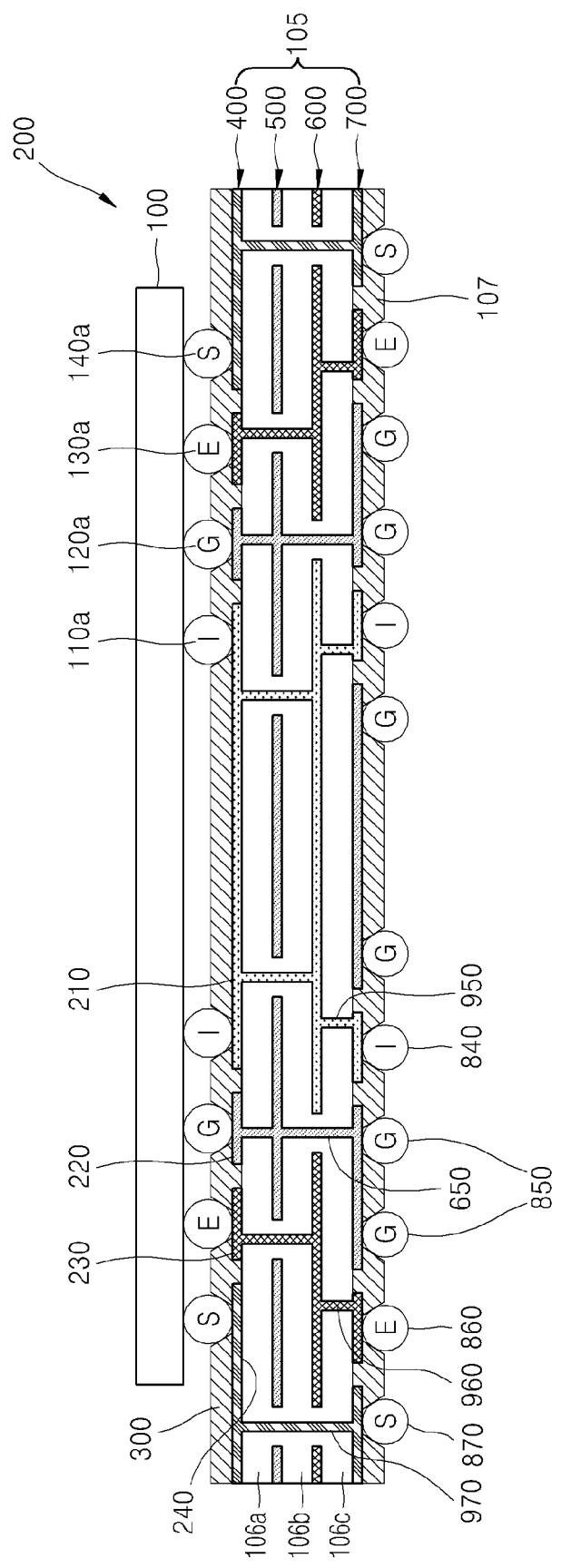
FIG. 2 is a cross-sectional diagram of a device package in accordance with another embodiment of the present inventive concepts.

FIG. 2 is a cross-sectional diagram of a device package in accordance with another embodiment of the present inventive concepts. The cross-section of FIG. 2 is taken, for example, across section line B-B' of FIG. 3C or 3D. In the embodiment of FIG. 2, the substrate 200 is substantially similar in configuration to the substrate of the embodiment of FIG. 1. In FIG. 2, however, one difference lies in that the chip 100 is of a flip-chip type that is bonded to the underlying substrate 200 using chip bonding bumps 110a, 120a, 130a, 140a. In the flip-chip embodiment, the chip bonding bumps 110a, 120a, 130a, 140a are positioned on the underside of the chip 100, or on the upper portion of the substrate 200, to provide for electrical bonding between the chip 100 and the substrate 200. The flip-chip arrangement allows for a reduction in area occupied by the substrate 200, relative to the wire-bond arrangement.

FIGS. 3A-3I are perspective views of different types of device packages in accordance with various embodiments of the present inventive concepts.

Figure 3A:
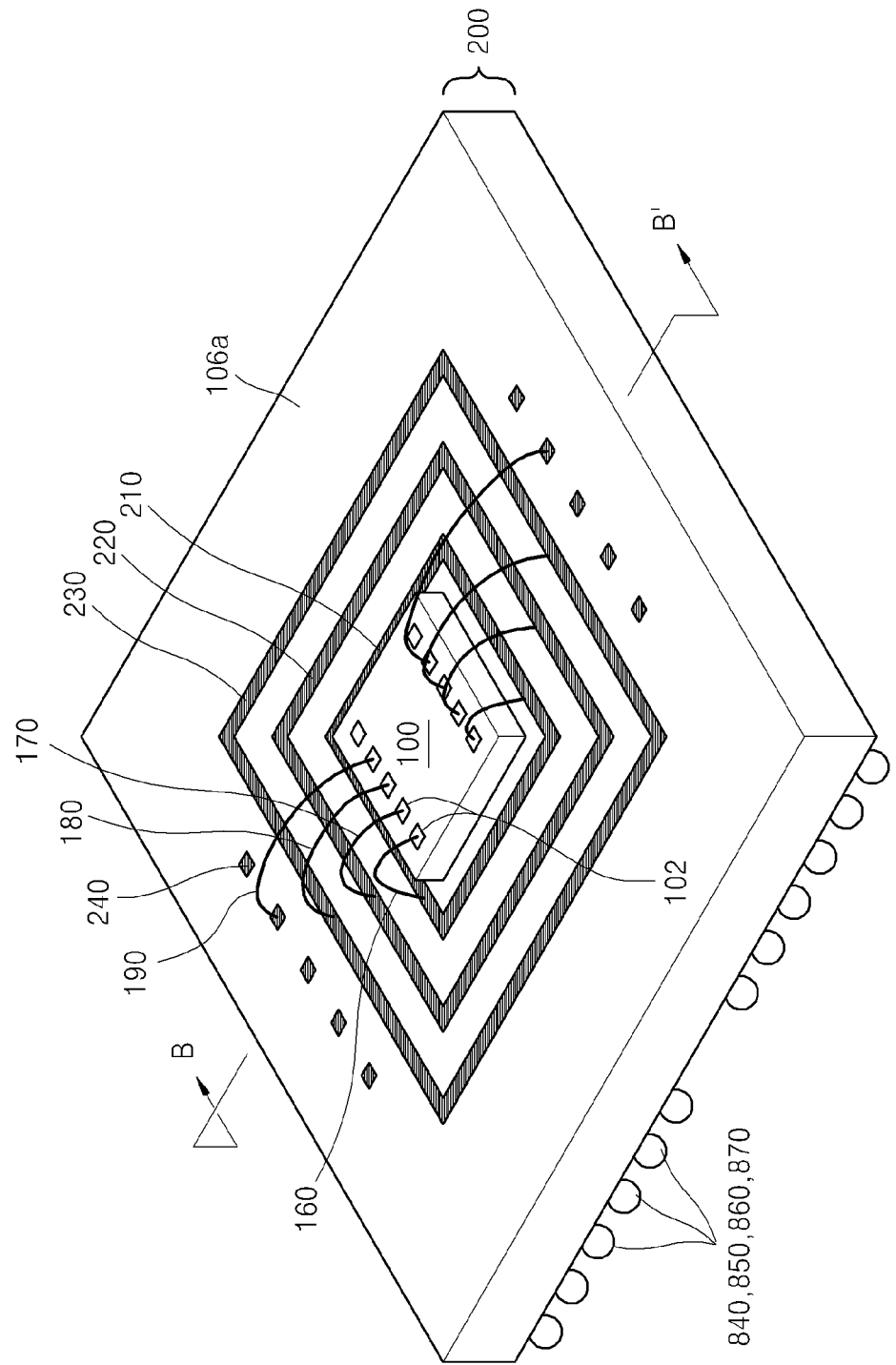
FIGS. 3A-3I are perspective views of different types of device packages in accordance with various embodiments of the present inventive concepts.

Referring to FIG. 3A, it can be seen in this embodiment, that the substrate bonding pads 210, 220, 230, 240 are on a top surface of the substrate 200. Referring to FIGS. 1 and 3A, the top, or first, conductive layer 400 from which the substrate bonding pads 210, 220, 230, 240 are patterned is disposed on the insulative layer 106a. It can also be seen that the first through third substrate bonding pads 210, 220, 230 comprise bonding regions in the shape of bonding rings that surround the bonding region of the chip 100. Also, it can be seen that the fourth substrate bonding pads 240 comprise discrete bonding pads that are formed separately from each other.

Figure 3B:
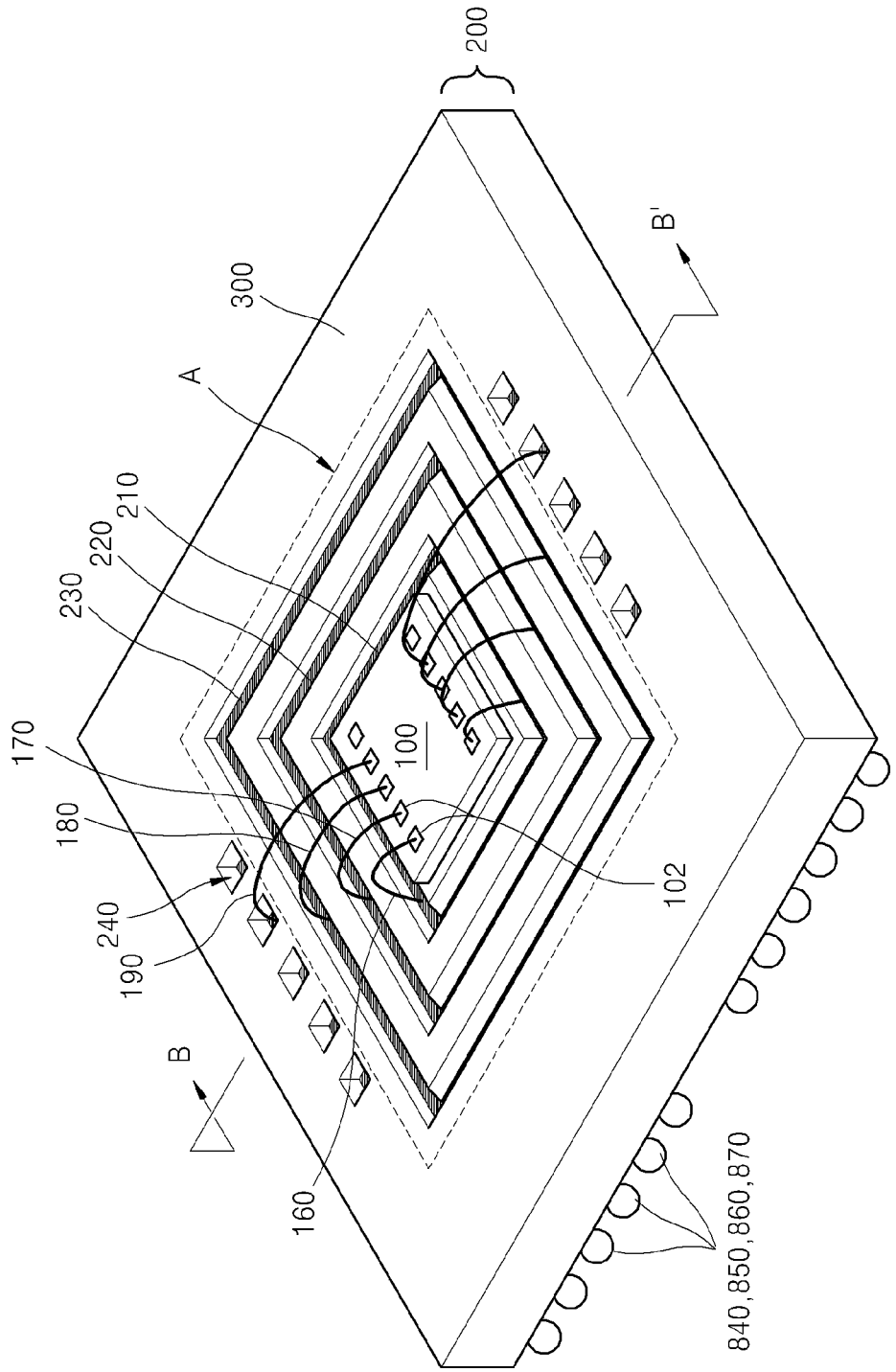

Referring to FIG. 3B, it can be seen that this embodiment is similar to the embodiment of FIG. 3A. Referring again to FIG. 1, the embodiment according to the FIG. 3B further comprises a layer of solder resist 300. The layer of solder resist 300 may be disposed on the first conductive layer 400 and includes patterned openings that expose the bonding pads 210, 220, 230, 240. As a result, the bonding pads 210, 220, 230, 240 are recessed below the top surface of the layer of solder resist 300.

Figure 3C:
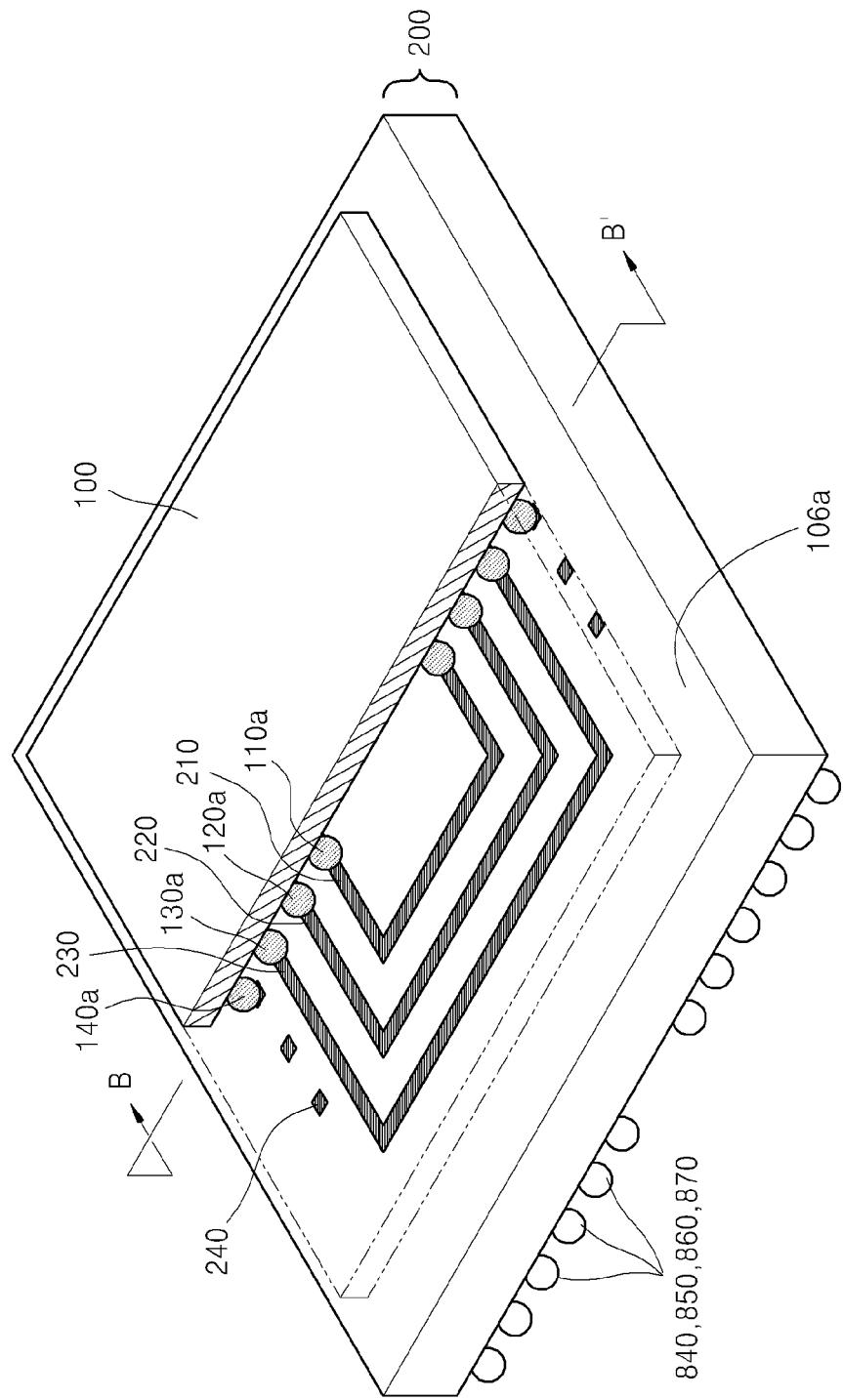

Referring to FIG. 3C, it can be seen that this embodiment is similar to the embodiment of FIG. 3A, one exception lying in that the chip 100 in this embodiment is a flip-chip style chip, and therefore, the chip 100 is bonded directly to the substrate 200 at the bonding bumps 110a, 120a, 130a, 140a.

Figure 3D:
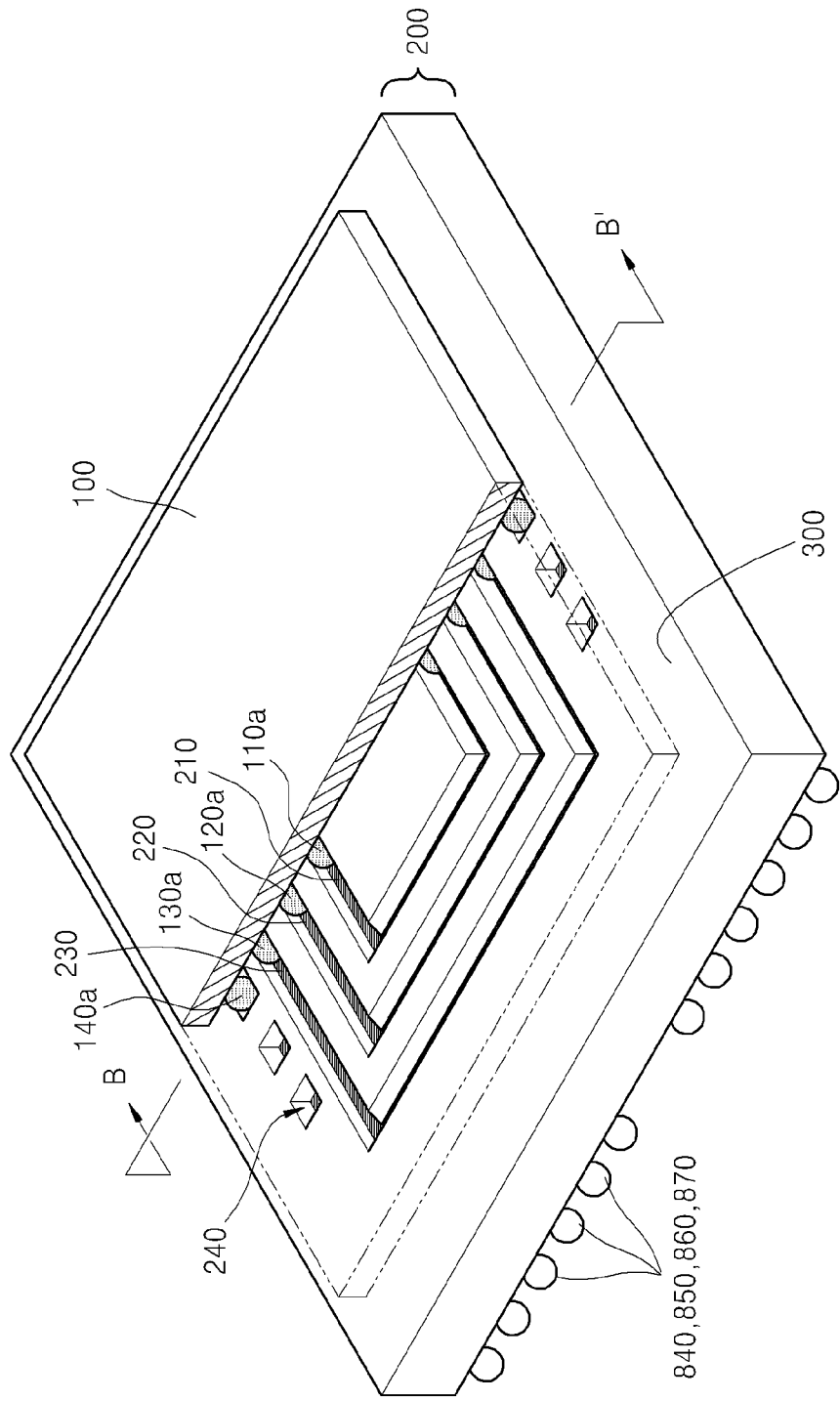

Referring to FIG. 3D, it can be seen that this embodiment is similar to the embodiment of FIG. 3C, one exception lying in that the substrate bonding pads 210, 220, 230, 240 are not on a top surface of the substrate 200, but rather are recessed below the upper surface of the substrate 200, as in the embodiment of FIG. 3B.

Figure 3E:
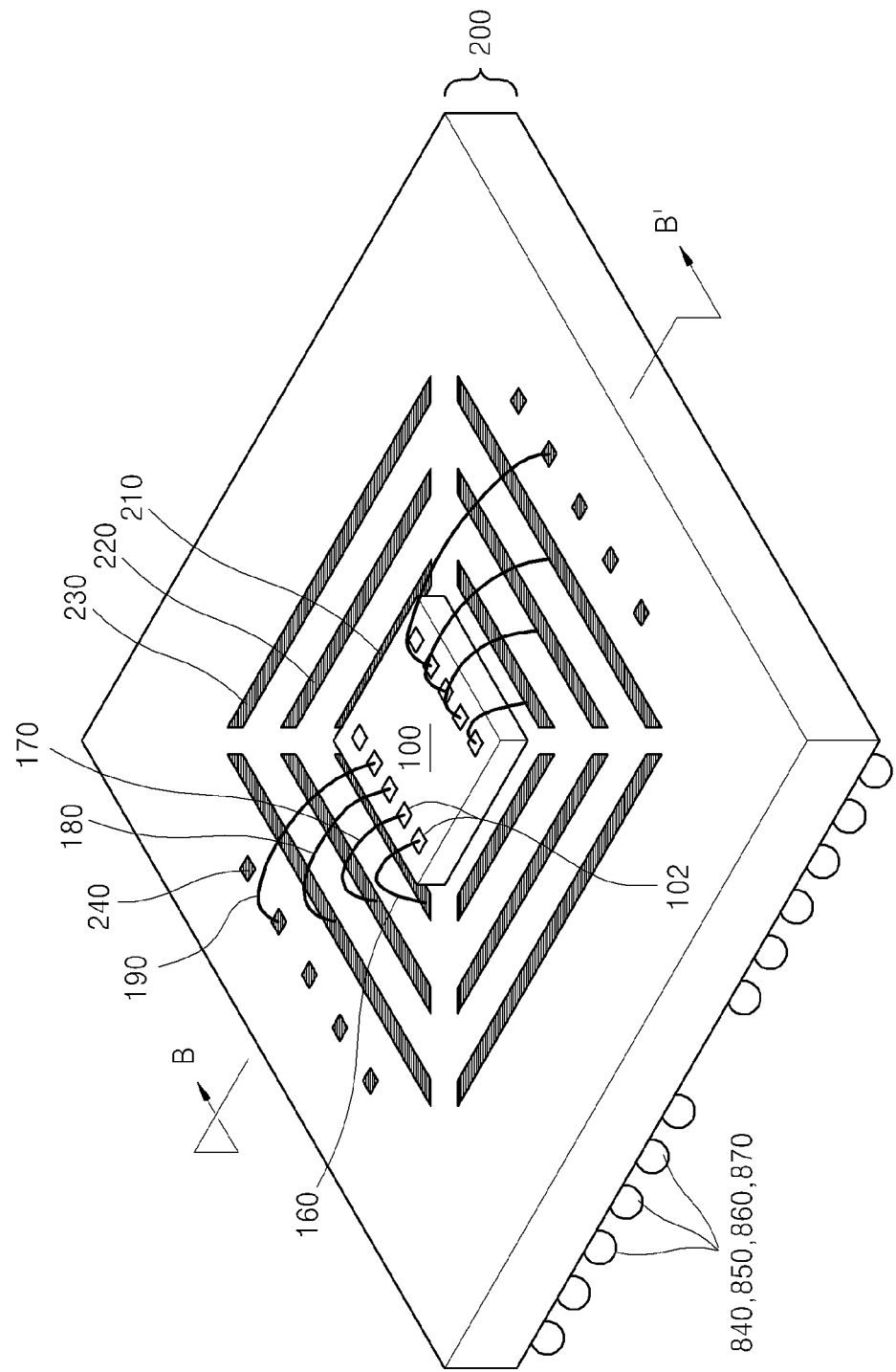

Referring to FIG. 3E, it can be seen that this embodiment is similar to the embodiment of FIG. 3A, an exception lying in that the substrate bonding pads related to power transfer 210, 220, 230 comprise segmented bonding regions.

Figure 3F:
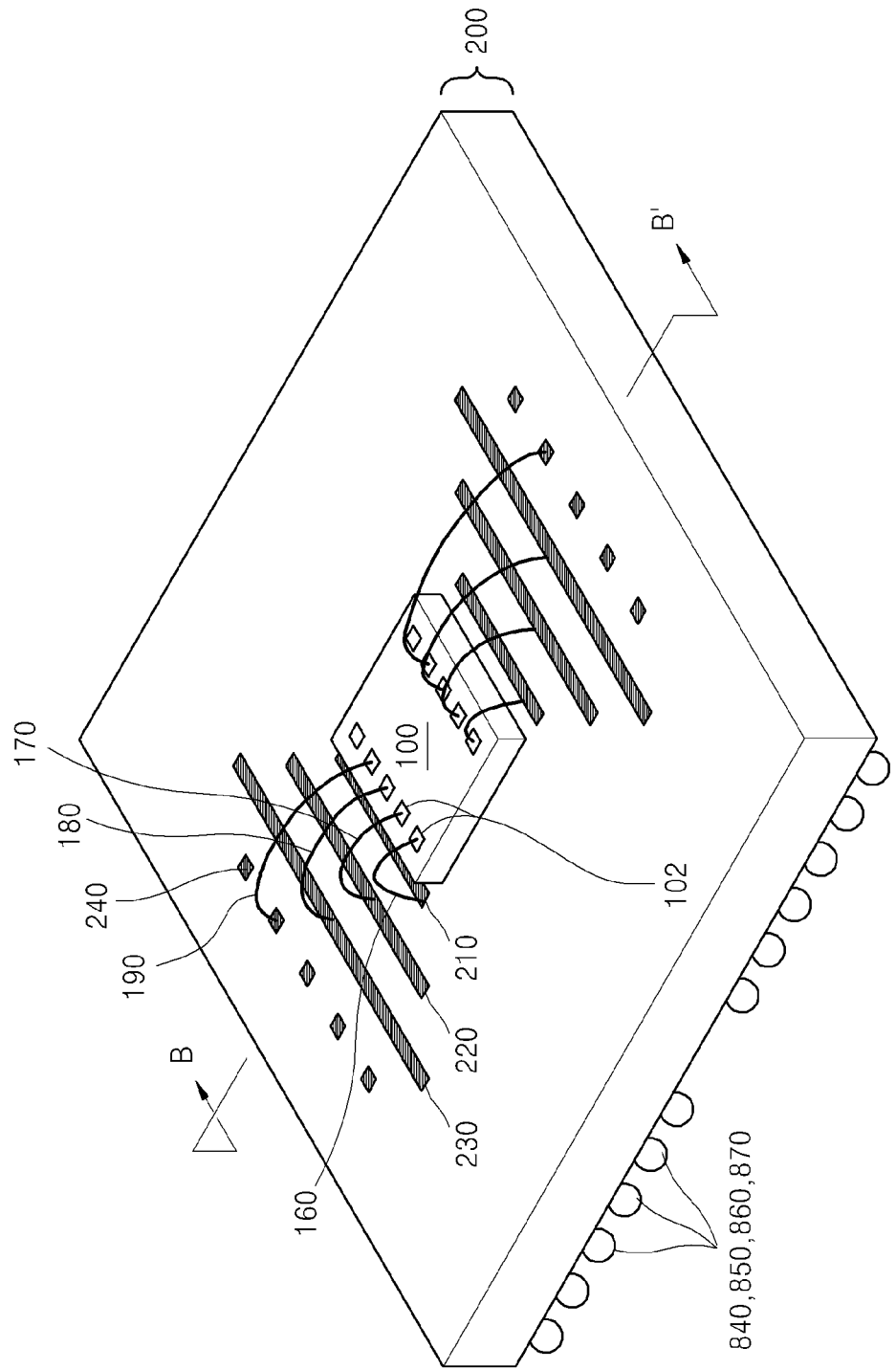

Referring to FIG. 3F, it can be seen that this embodiment is similar to the embodiment of FIG. 3A, an exception lying in that the substrate bonding pads related to power transfer 210, 220, 230 comprise bonding regions that lie at only two sides of the chip 100.

Figure 3G:
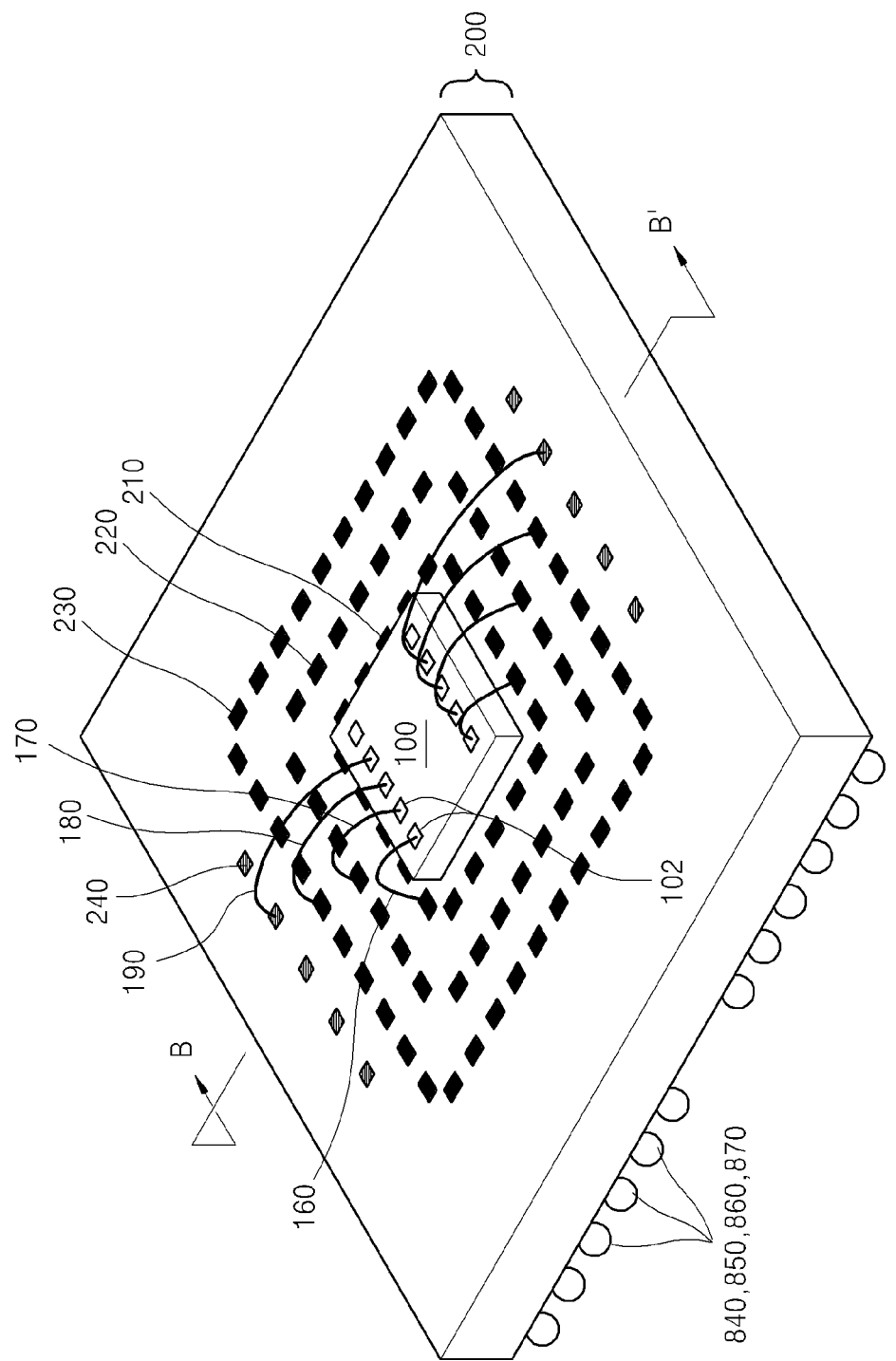

Referring to FIG. 3G, it can be seen that this embodiment is similar to the embodiment of FIG. 3A, an exception lying in that the substrate bonding pads related to power transfer 210, 220, 230 comprise discrete bonding pads that are generally arranged in linear rows.

Figure 3H:
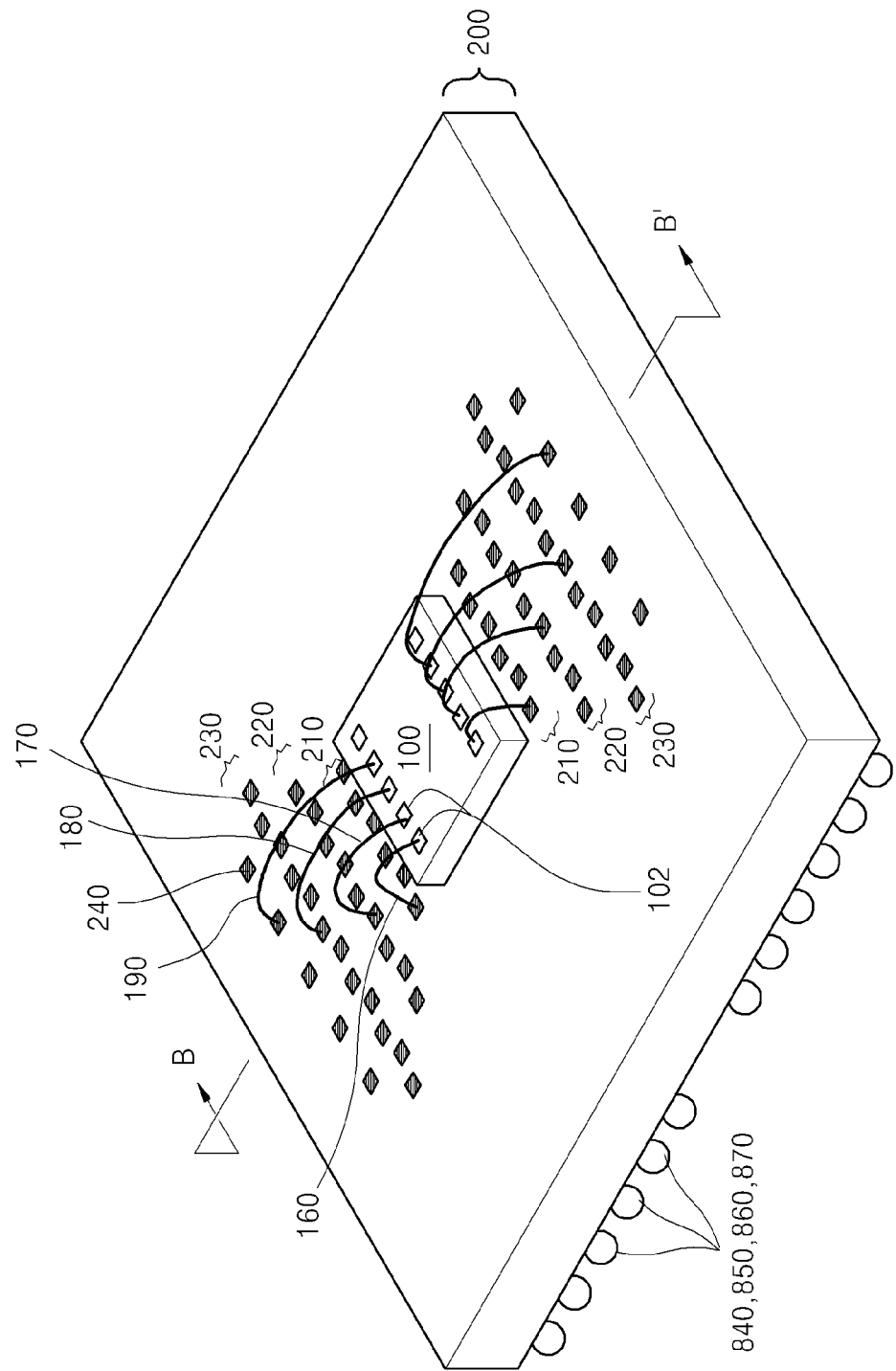

Referring to FIG. 3H, it can be seen that this embodiment is similar to the embodiment of FIG. 3A, an exception lying in that the substrate bonding pads related to power transfer 210, 220, 230 comprise discrete bonding pads that are generally arranged in linear rows with alternating pads of each linear row being offset in a horizontal direction.

Figure 3I:
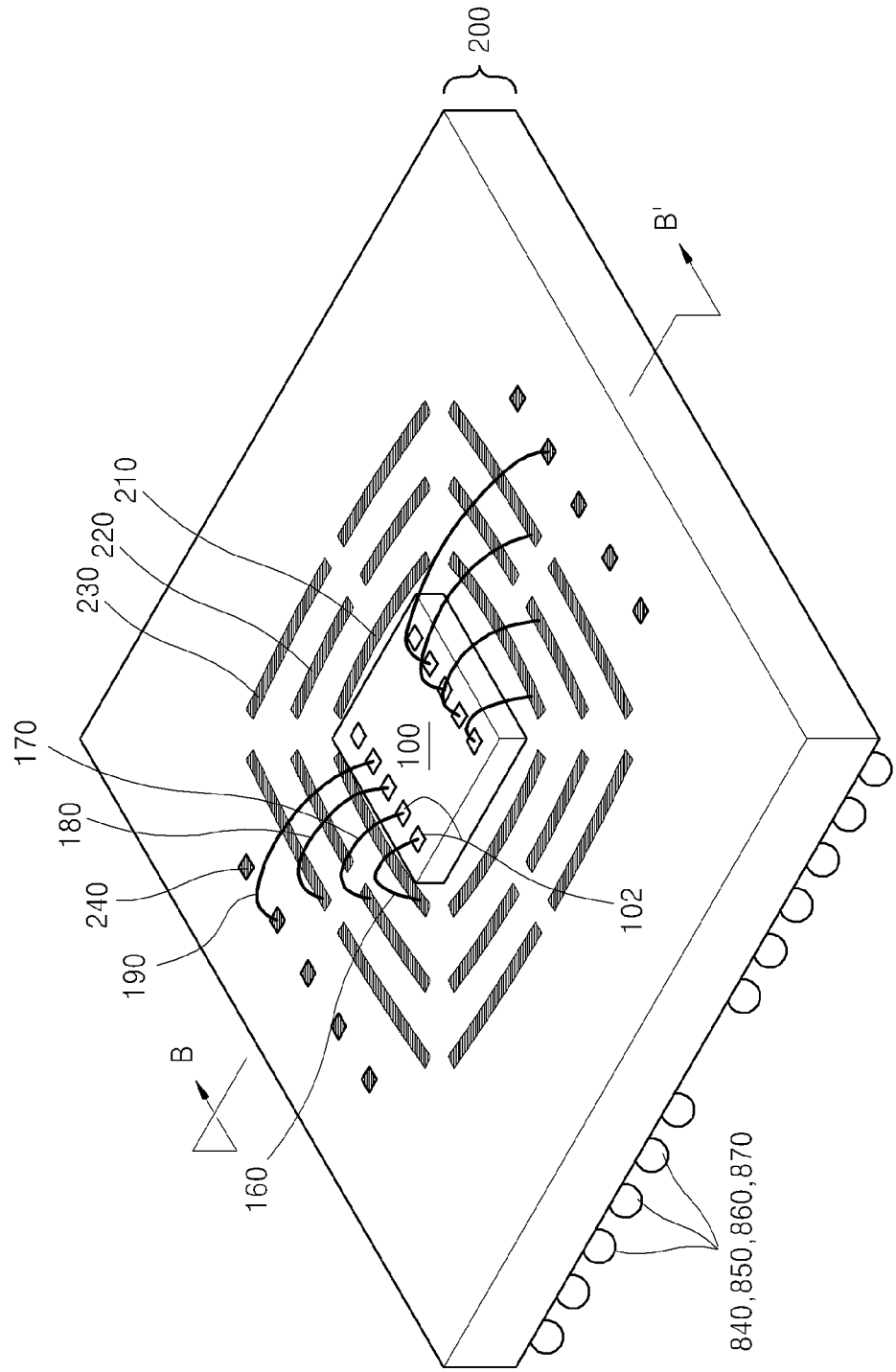

Referring to FIG. 3I, it can be seen that this embodiment is similar to the embodiment of FIG. 3A, an exception lying in that the substrate bonding pads related to power transfer 210, 220, 230 comprise bonding regions that are curved and non-linear.

In one embodiment, a chip bonding region at which a chip 100 is positioned is defined for a substrate. A bonding region comprises a first bonding region, a second bonding region and a third bonding region. Referring to the embodiments of FIGS. 1, 2 and 3A-3I, the first bonding region that is closest to a center of the chip bonding region among the first, second and third bonding regions is configured to carry a first voltage. In one embodiment, the first bonding region comprises substrate bonding ring 210 that surrounds the chip 100, and carries one of the VDDI and VDDE voltages. A second bonding region that is most distant the chip bonding region among the first, second and third bonding regions is configured to carry a second voltage. In one embodiment, the second bonding region comprises substrate bonding ring 230 that surrounds the chip 100, and carries the other one of the VDDI and VDDE voltages. A third bonding region is positioned between the first bonding region and the second bonding region and is configured to carry a third voltage that is less than the first voltage and the second voltage. In one embodiment, the third bonding region comprises substrate bonding ring 220 that is positioned, in a horizontal direction of the substrate, between the first substrate bonding ring 210 and the second substrate bonding ring 230, and carries the GND voltage. Signal bonding regions 240 are positioned beyond the second bonding region 230 for transferring data and control signals between the chip 100 and the substrate 200.

In the present example embodiments of the inventive concepts, the third bonding region is positioned in the substrate between the first bonding region and the second bonding region. In one example, the VSS, or ground, bonding region is positioned between the VDDI bonding region and the VDDE bonding region. As a result, the bonding wire 170 coupled to the third substrate bonding ring 220 operates as a ground shield between the bonding wire 160 coupled to the first substrate bonding ring 210 carrying the VDDI voltage and the bonding wire 180 coupled to the second substrate bonding ring 230 carrying the VDDE voltage. Thus, the bonding wire 170 operates effectively as a ground shield between the bonding wire 160 and the bonding wire 180, thereby further mitigating or preventing crosstalk between the VDDI and the VDDE voltage signals during high-frequency operation of the device.

In addition, in certain embodiments of the present inventive concepts, the substrate 200 is configured so that the first vertical interconnects 540, 950 are positioned to transfer the voltage applied to the first package leads 840 in a generally vertical direction to the first substrate bonding ring 210. In this example, since the VDDI voltage is to be applied to the first substrate bonding ring 210, the first package leads 840 are referenced as "I". Further, the second vertical interconnects 560, 960 are positioned to transfer the voltage applied to the second package leads 860 in a generally vertical direction to the second substrate bonding ring 230. In this example, since the VDDE voltage is to be applied to the second substrate bonding ring 230, the second package leads 860 are referenced as "E". Further, the third vertical interconnects 650, 910 are positioned to transfer the voltage applied to the third package leads 850 in a generally vertical direction to the third substrate bonding ring 220. In this example, since the VSS, or ground, voltage is to be applied to the third substrate bonding ring 220, the third package leads 850 are referenced as "G".

Figure 4A:
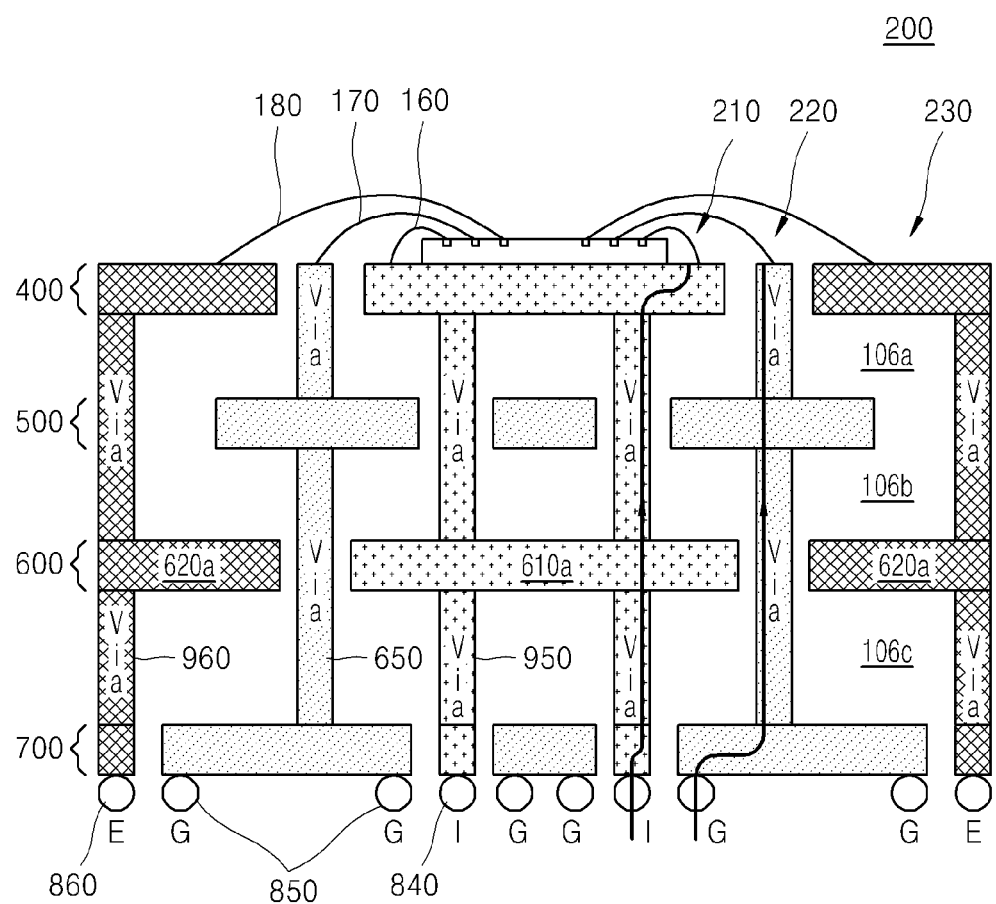
FIGS. 4A and 4B are close-up cross-sectional illustrations of the substrate configuration, in accordance with embodiments of the present inventive concepts.
Figure 4B:
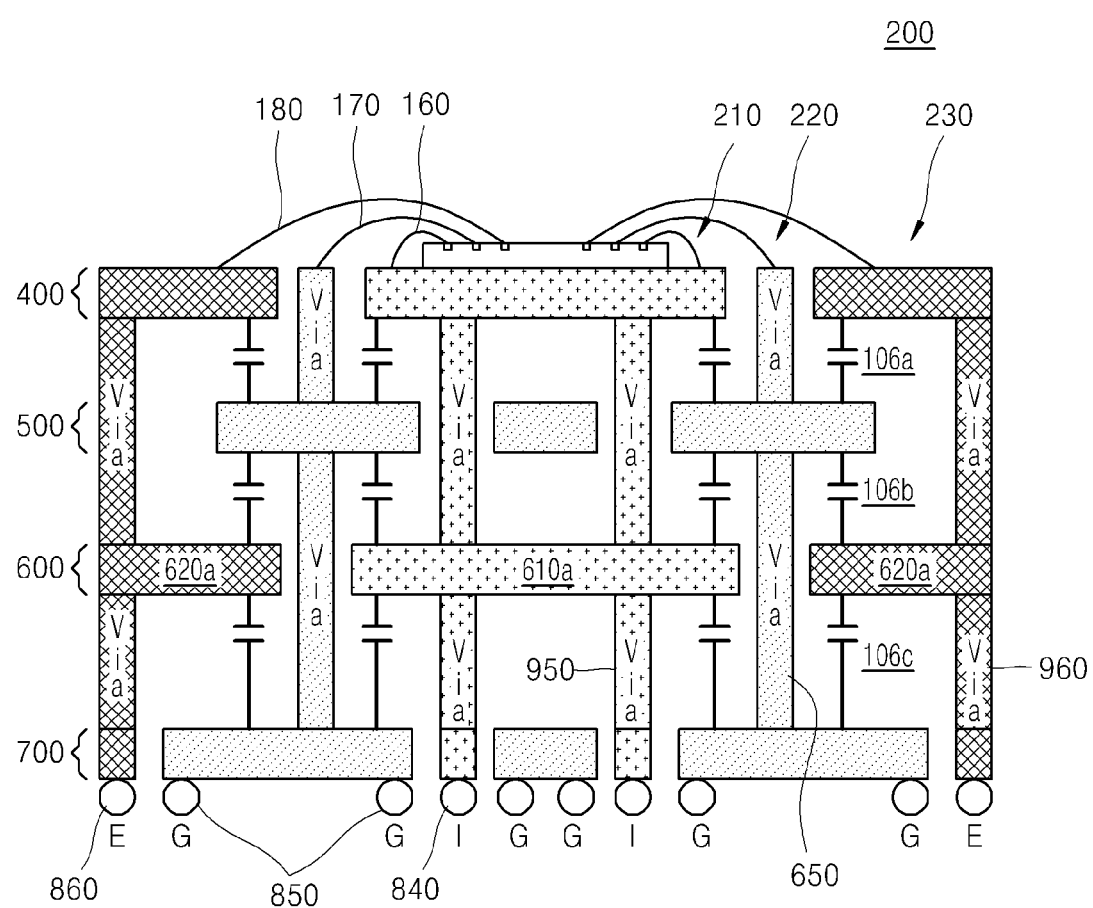

FIGS. 4A and 4B are close-up cross-sectional illustrations of the substrate 200 configuration, in accordance with embodiments of the present inventive concepts. The close-up cross-sectional views of FIGS. 4A and 4B correspond to the region "A", outlined in the embodiment of FIG. 3B. In this illustration, it can be seen that the first conductive layer 400 includes the first substrate bonding ring 210 for carrying the VDDI voltage, the second substrate bonding ring 230 for carrying the VDDE voltage, and the third substrate bonding ring 220 for carrying the GND voltage. It can also be seen in this illustration that the second conductive layer 500 generally comprises a ground plane for carrying the GND voltage. It can also be seen in this illustration that the third conductive layer 600 generally comprises a power plane for carrying the VDDI voltage, at a first inner region 610a of the third conductive layer 600, and a power plane for carrying the VDDE voltage, at a second inner region 620a of the third conductive layer 600. It can also be seen in this illustration that the fourth conductive layer 700 generally comprises a contact plane at which the first, second and third package leads 840, 860, 850, in this case solder balls, are connected. A majority of the fourth conductive layer 700 comprises a power plane for carrying the GND voltage.

As described above, the spaces between the first, second, third and fourth conductive layers 400, 500, 600, 700 comprise insulative layers 106a, 106b, 106c, for example comprising dielectric material. As a result, and because the power and ground planes alternate in the vertical direction of the substrate 200, capacitance is present in a vertical direction between the first and second conductive layers 400, 500, between the second and third conductive layers 500, 600, and between the third and fourth conductive layers 600, 700, as shown in the conceptual cross-sectional illustration FIG. 4B. This capacitance is enhanced by forming the majority of the first conductive layer 400 to be the power plane for carrying the VDDI voltage and the majority of the fourth conductive layer 700 to be the ground plane for carrying the GND voltage, in this example embodiment. Since the ground plane is positioned between the power planes, interference or crosstalk between the first power signal VDDI and the second power signal VDDE is greatly reduced in the substrate.

Further, since the second conductive layer 500 in this example embodiment is a ground plane for carrying the GND voltage, and since it is positioned vertically between the first and third conductive layers 400, 600, which are power planes for carrying the first power voltage VDDI and the second power signal VDDE respectively, capacitance is further increased between these power planes VDDI, VDDE relative to ground VSS. For example, the first conductive layer 400 for carrying the first power voltage VDDI, the insulative layer 106a, and the second conductive layer 500 for carrying the GND voltage can operate as a first capacitor. The second conductive layer 500 for carrying the GND voltage, the insulative layer 106b, and the third conductive layer 600 for carrying the first power voltage VDDE can operate as a second capacitor. The third conductive layer 600 for carrying the VDDE voltage, the insulative layer 106c, and fourth conductive layer 700 for carrying the ground VDDE can operate as a third capacitor. As a result of increased capacitance of the three capacitors, more power can be stored in the substrate 200, and therefore, during start-up of the device, the device can be initialized more quickly, due to the increased power storage. In some embodiments, the increased capacitance can be from about 1.5 to about 2 times greater than the capacitance obtained in a case where the first conductive layer 400 receives the GND voltage and the second conductive layer 500 receives the first voltage VDDI.

The capacitors may be formed to have a linear or planar shape in accordance with the shape of the first, second, third and fourth conductive layers 400, 500, 600, 700. The capacitance is increased in proportion to the resulting area of the capacitor; therefore, the first, second, third and fourth conductive layers 400, 500, 600, 700 can have primarily planar shapes.

In addition, in the present example embodiment, the first package leads 840 (I) are overlapped by, or otherwise lie generally directly below, the first substrate bonding ring or first substrate bonding regions 210 in a vertical direction. Also, the second package leads 860 (E) lie generally directly below the second substrate bonding ring or second substrate bonding regions 230 in a vertical direction. Also, the third package leads 850 (G) lie generally directly below the third substrate bonding ring or third substrate bonding regions 220 in a vertical direction. As a result, the third package leads 850 (G) are positioned between the first package leads 840 (I) and the second package leads 860 (E). Accordingly, the current paths between the package leads 840, 860, 850 and their corresponding substrate bonding regions 210, 230, 220 are minimized in length. Generally a current path has an inherent inductance that causes fluctuation or simultaneous switching noise when a signal on the current path is switched on. According to an embodiment of the present inventive concept, the relative lengths of the current paths can be minimized, resulting in a reduced inductance. As such, the fluctuation or the simultaneous switching noise of the resulting circuit can be decreased. As a result, the quality of power transmission along the current paths is thereby increased.

Figure 5A:
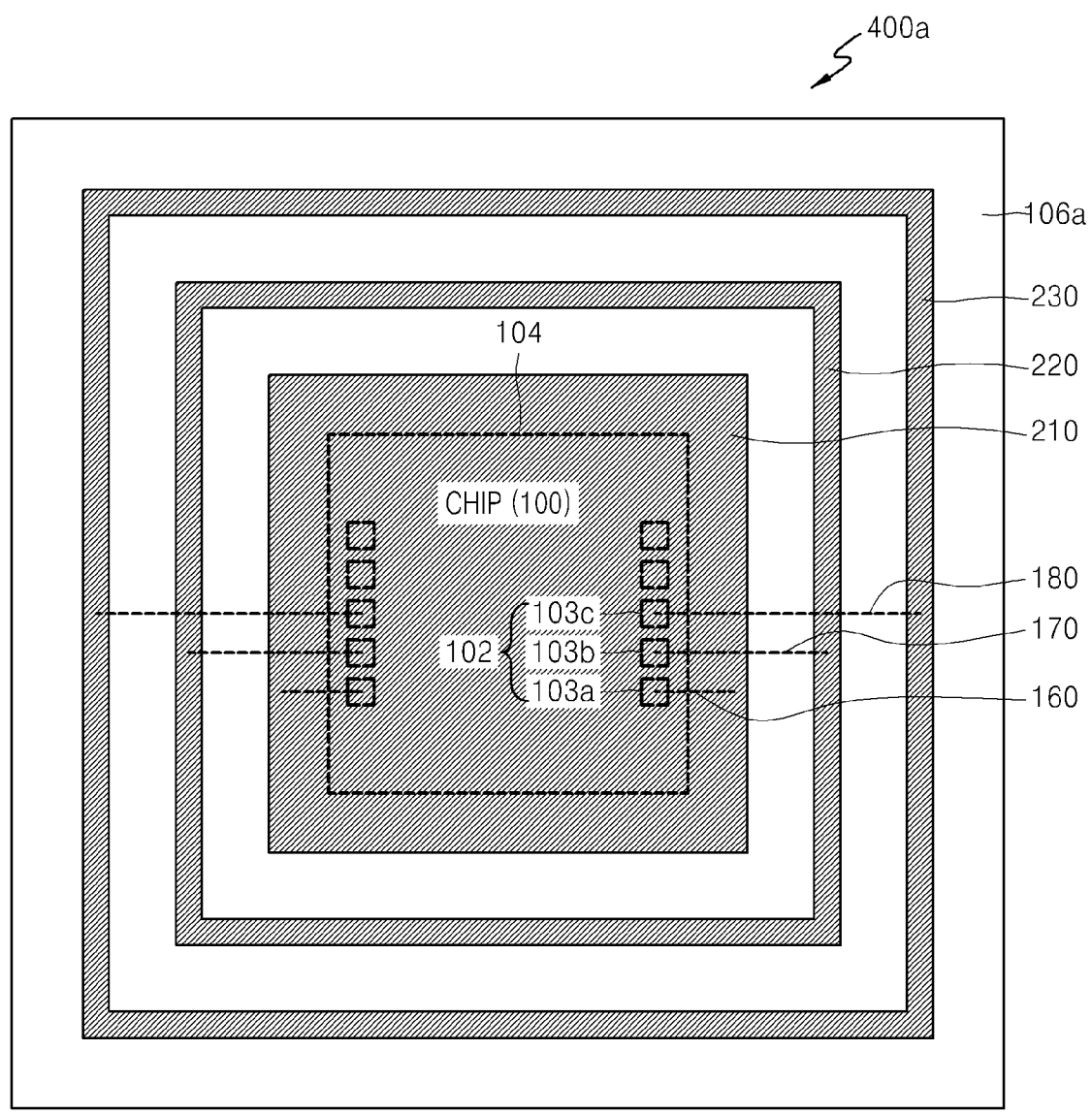
FIG. 5A is plan view of the first conductive layer of the embodiment of the substrate of FIG. 4A, in accordance with an embodiment of the present inventive concepts.

FIG. 5A is plan view of the first conductive layer 400a of the embodiment of the substrate 200 of FIG. 4A, in accordance with an embodiment of the present inventive concepts. In the embodiment of FIG. 5A, referring to FIG. 4A, the substrate bonding pads 210, 220, 230, 240 may be disposed on a surface of the insulative layer 106a. The chip 100 is positioned at a chip bonding region 104 of the substrate 200. In the present example, the first conductive layer 400a includes a first substrate bonding pad 210 that covers the chip bonding region 104, and further includes a conductive ring surrounding the chip bonding region 104 that includes locations at which a first chip bonding pad 103a designated as a first power bonding pad for the chip 100 can be bonded to the first substrate bonding pad 210 by the first bonding wire 160. In this case, the body of the chip 100 can also optionally be in electrical contact with the first substrate bonding pad 210 at an underside of the body, to provide a voltage supply for the chip 100. The first conductive layer 400a further includes a second substrate bonding pad 230 that surrounds, and is spaced apart from, the first substrate bonding pad 210. In this case, the second substrate boding pad 230 is in the shape of a conductive ring. As described above, the second substrate bonding pad 230 includes locations at which a second chip bonding pad 103c designated as a second power bonding pad for the chip 100 can be bonded to the second substrate bonding pad 230 by the second bonding wire 180. The first conductive layer 400 further includes a third substrate bonding pad 220 that surrounds, and is spaced apart from, the first substrate bonding pad 210, and is surrounded by, and is spaced apart from, the second substrate bonding pad 230. In this case, the third substrate bonding pad 220 is in the shape of a conductive ring. As described above, the third substrate bonding pad 220 includes locations at which a third chip bonding pad 103b designated as a third power bonding pad for the chip 100 can be bonded to the third substrate bonding pad 220 by the third bonding wire 170. In this example, of the substrate bonding pads that transfer power to the chip 100, the first substrate bonding pad 210 is closest in a horizontal direction to the center of the chip bonding position, the second substrate bonding pad 230 is furthest in a horizontal direction from the center of the chip bonding position, and the third substrate bonding pad 220 is positioned between the first substrate bonding pad 210 and the second substrate bonding pad 230 in a horizontal direction, relative to the center of the chip bonding position. The term "ring", as used herein, is intended to define a geometry that surrounds, whether contiguous or segmented, and includes, for example, square-shaped and rectangular-shaped rings, and other suitable ring shapes, including circular, oval, etc.

Figure 5B:
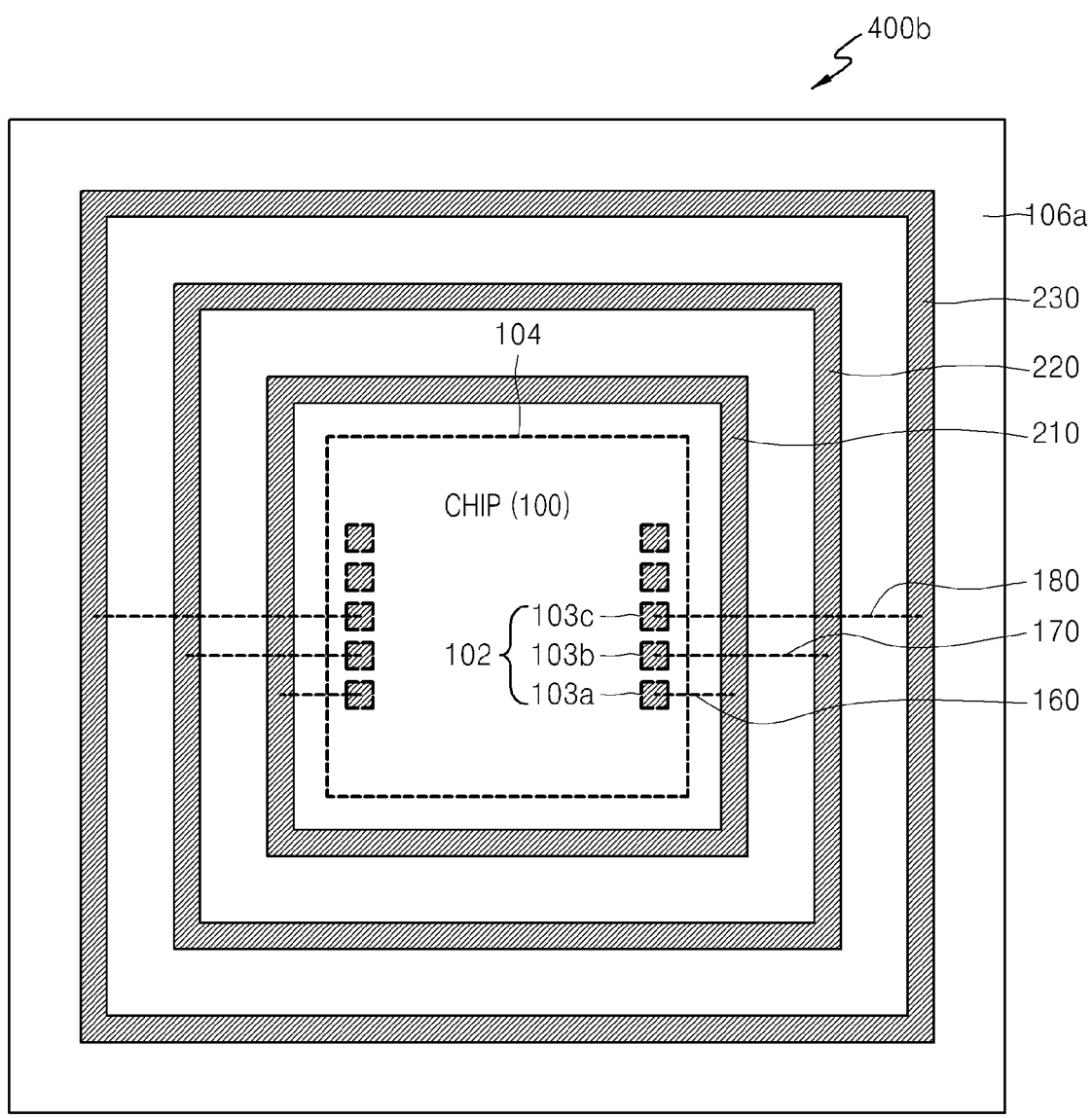
FIG. 5B is plan view of the first conductive layer of the embodiment of the substrate of FIG. 4A, in accordance with another embodiment of the present inventive concepts.

FIG. 5B is plan view of the first conductive layer 400 of the embodiment of the substrate 200 of FIG. 4A, in accordance with another embodiment of the present inventive concepts. The embodiment of FIG. 5B is similar in configuration to that of FIG. 5A, an exception lying in that the first conductive layer 400b of FIG. 5B has a first substrate bonding pad 210 that surrounds, but does not cover, the chip bonding region 104, so that it is ring-shaped. In this case, the underside of the chip 100 is isolated from the substrate 200 and does not receive a reference voltage from the substrate 200.

It can be seen in the examples of FIGS. 5A and 5B that, in a case where the first and second substrate bonding pads 210, 230 receive the VDDI and VDDE voltages, and where the third substrate bonding pad 220 receives the VSS or GND voltage, the third substrate bonding pad 220 having the GND voltage operates to isolate or shield the first and second substrate bonding pads 210, 230 having the VDDI or VDDE voltages in a horizontal direction of the substrate.

Figure 6A:
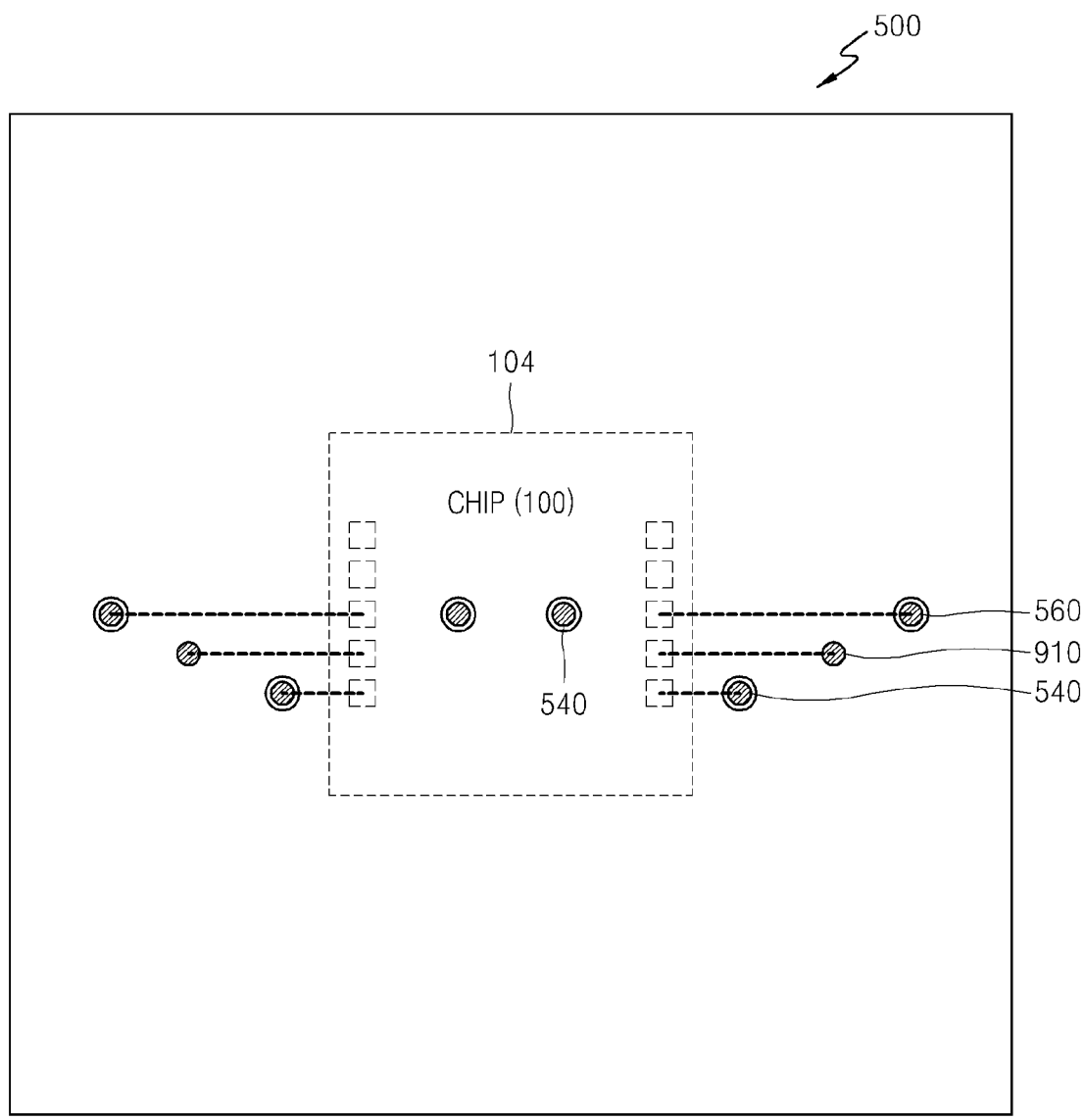
FIG. 6A is a plan view of the second conductive layer of the embodiment of the substrate of FIG. 4A, in accordance with another embodiment of the present inventive concepts.
Figure 6B:
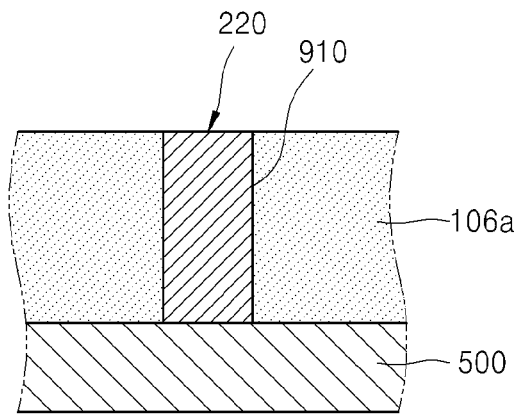
FIG. 6B is a close-up cross-sectional view of the third vertical interconnect that connects the third substrate bonding pad to the conductive plane of the second conductive layer of the substrate.
Figure 6C:
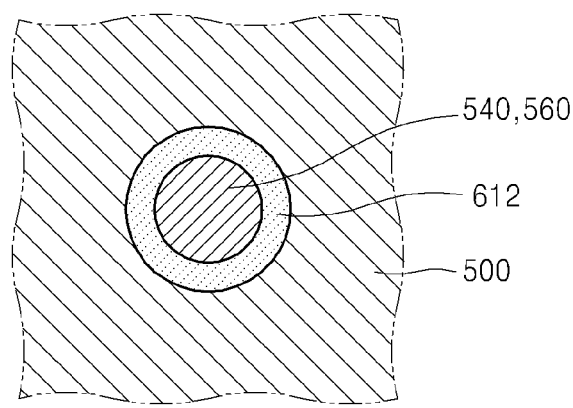
FIG. 6C is a close-up plan view of the first and second vertical interconnects that are insulated from the conductive plane of the second conductive layer of the substrate.

FIG. 6A is a plan view of the second conductive layer 500 of the embodiment of the substrate 200 of FIG. 4A, in accordance with another embodiment of the present inventive concepts. FIG. 6B is a close-up cross-sectional view of the third vertical interconnect 910 that connects the third substrate bonding pad 220 to the conductive plane of the second conductive layer 500 of the substrate 200. FIG. 6C is a close-up plan view of the first and second vertical interconnects 540, 560 that are insulated from the conductive plane of the second conductive layer 500 of the substrate 200. In this embodiment, it can be seen that the third vertical interconnect 910 is configured to make direct contact with the second conductive layer 500. A top portion of the third vertical interconnect 910 comprises, or otherwise contacts, the third substrate bonding pad 220. In an example where the conductive plane of the second conductive layer 500 carries the GND voltage, a plurality of the third vertical interconnects 910 transfer the GND voltage to the third substrate bonding pad 220. At the same time, with reference to FIG. 6C, the first and second vertical interconnects 540, 560, pass through, and are insulated from, the conductive plane of the second conductive layer 500 by insulative region 612. The insulative region 612 may comprise the insulative layer 106a. In an example where the VDDI and VDDE voltages are applied to the first and second substrate bonding pads 210, 230, these voltage levels are transferred to the first and second substrate bonding pads 210, 230 by a plurality of the first and second vertical interconnects 540, 560.

Figure 7:
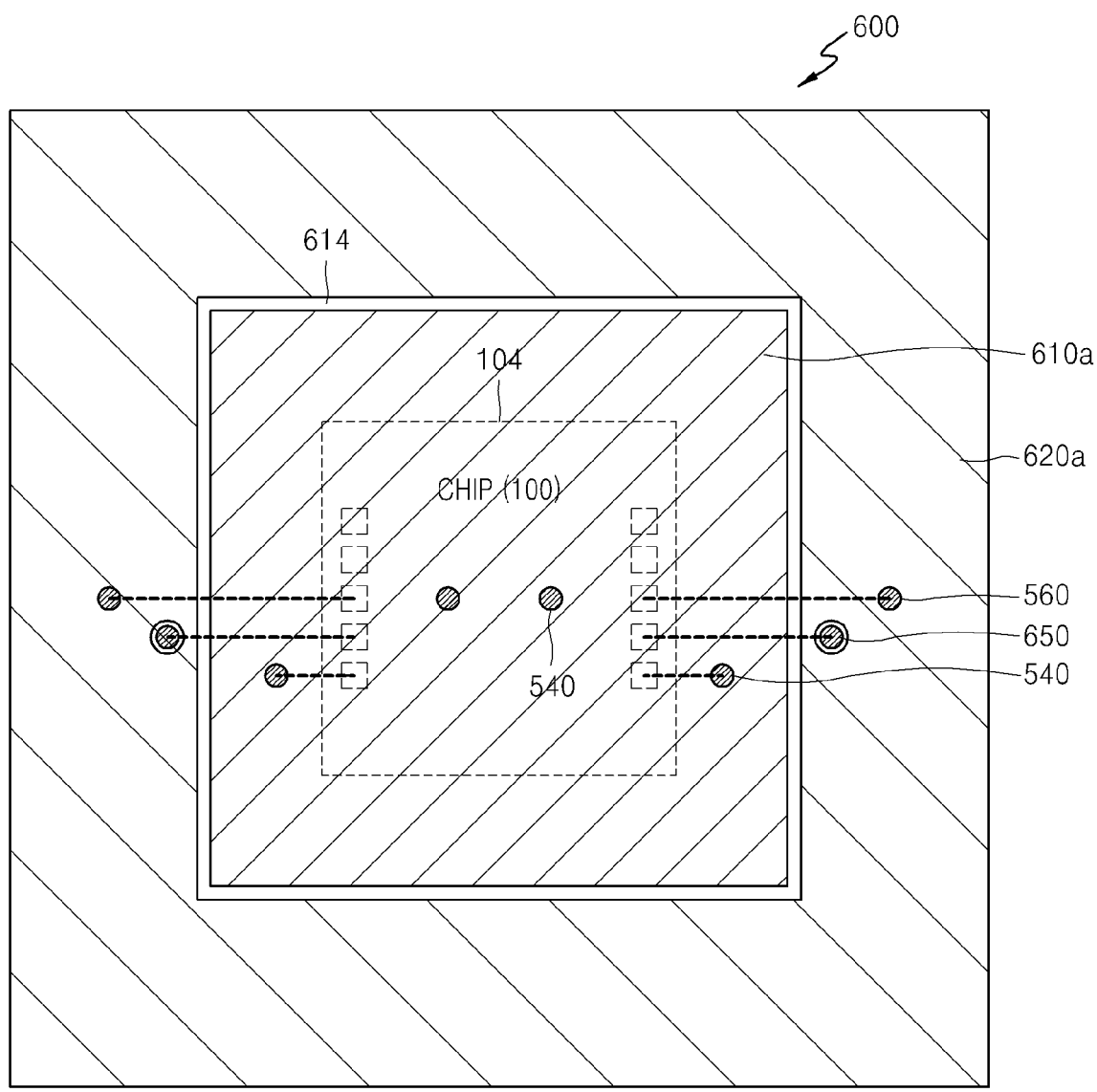
FIG. 7 is a plan view of the third conductive layer of the embodiment of the substrate of FIG. 4A, in accordance with another embodiment of the present inventive concepts.

FIG. 7 is a plan view of the third conductive layer 600 of the embodiment of the substrate 200 of FIG. 4A, in accordance with another embodiment of the present inventive concepts. In this embodiment, it can be seen that the third conductive layer 600 comprises a first inner region 610a and a second inner region 620a, in turn comprising conductive planes that are insulated from each other by insulative region 614. The insulative region 614 may comprise the insulative layer 106b. It can also be seen that the third vertical interconnects 650 pass through, and are insulated from, the conductive planes 610a, 620a of the third conductive layer 600, and that the first and second vertical interconnects 540, 560 are configured to make direct contact with the first and second inner regions 610a, 620a of the third conductive layer 600 respectively. In an example where the VDDI and VDDE voltages are applied to the first and second substrate bonding pads 210, 230, these voltage levels are transferred to the first and second substrate bonding pads 210, 230 by a plurality of the first and second vertical interconnects 540, 560.

Figure 8:
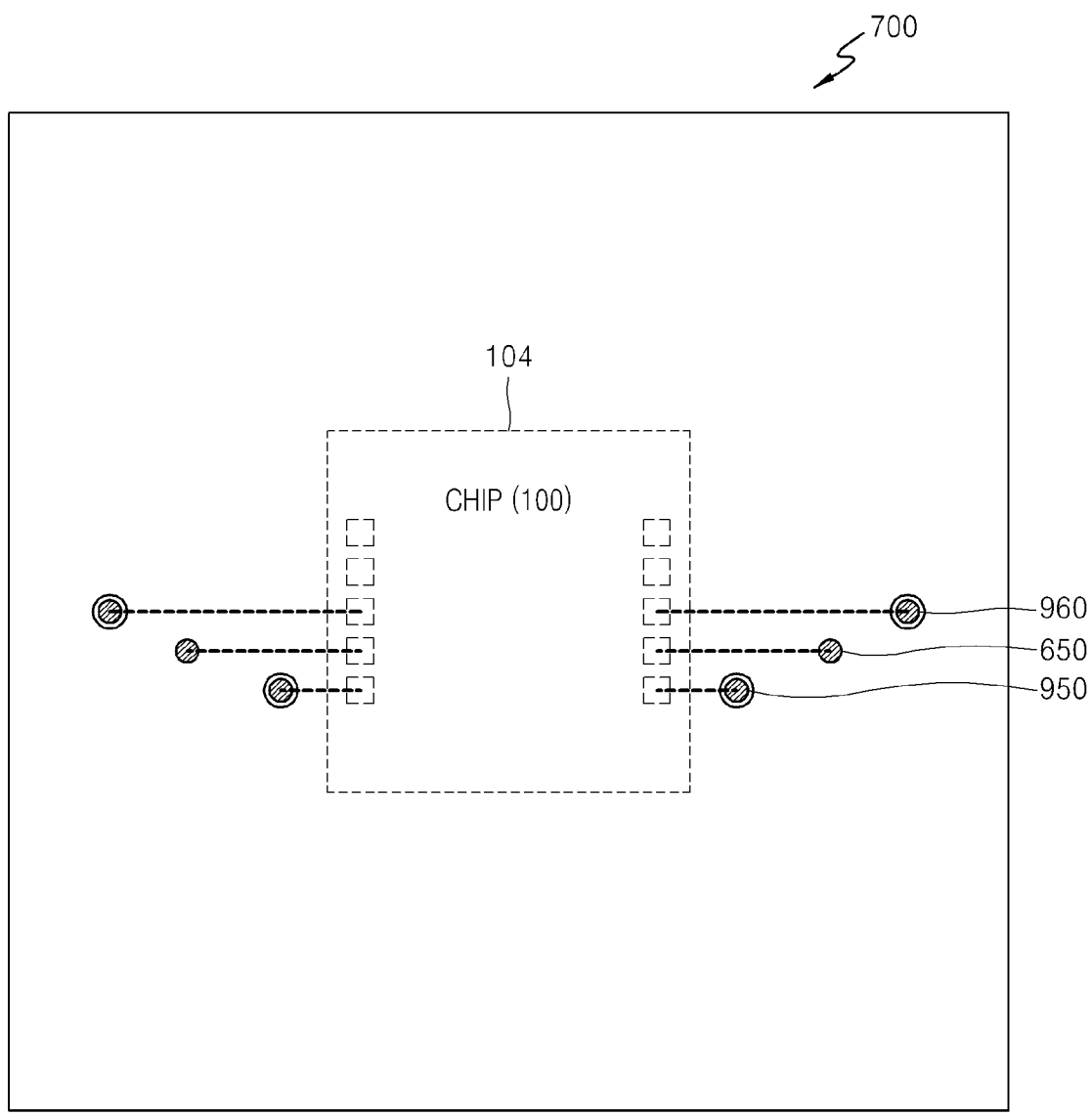
FIG. 8 is a plan view of the fourth conductive layer of the embodiment of the substrate of FIG. 4A, in accordance with another embodiment of the present inventive concepts.

FIG. 8 is a plan view of the fourth conductive layer 700 of the embodiment of the substrate 200 of FIG. 4A, in accordance with another embodiment of the present inventive concepts. In this embodiment, it can be seen that the fourth conductive layer 700 comprises a conductive plane. It can also be seen that the third vertical interconnects 650 are configured to make direct contact with the fourth conductive layer 700. It can also be seen that the first and second vertical interconnects 950, 960 pass through, and are insulated from, the conductive plane of the fourth conductive layer 700. In example where the GND voltage is applied to the third substrate bonding pad 220 this voltage level is transferred to the third substrate bonding pad 220 by a plurality of the third vertical interconnects 650, 910.

Figure 9A:
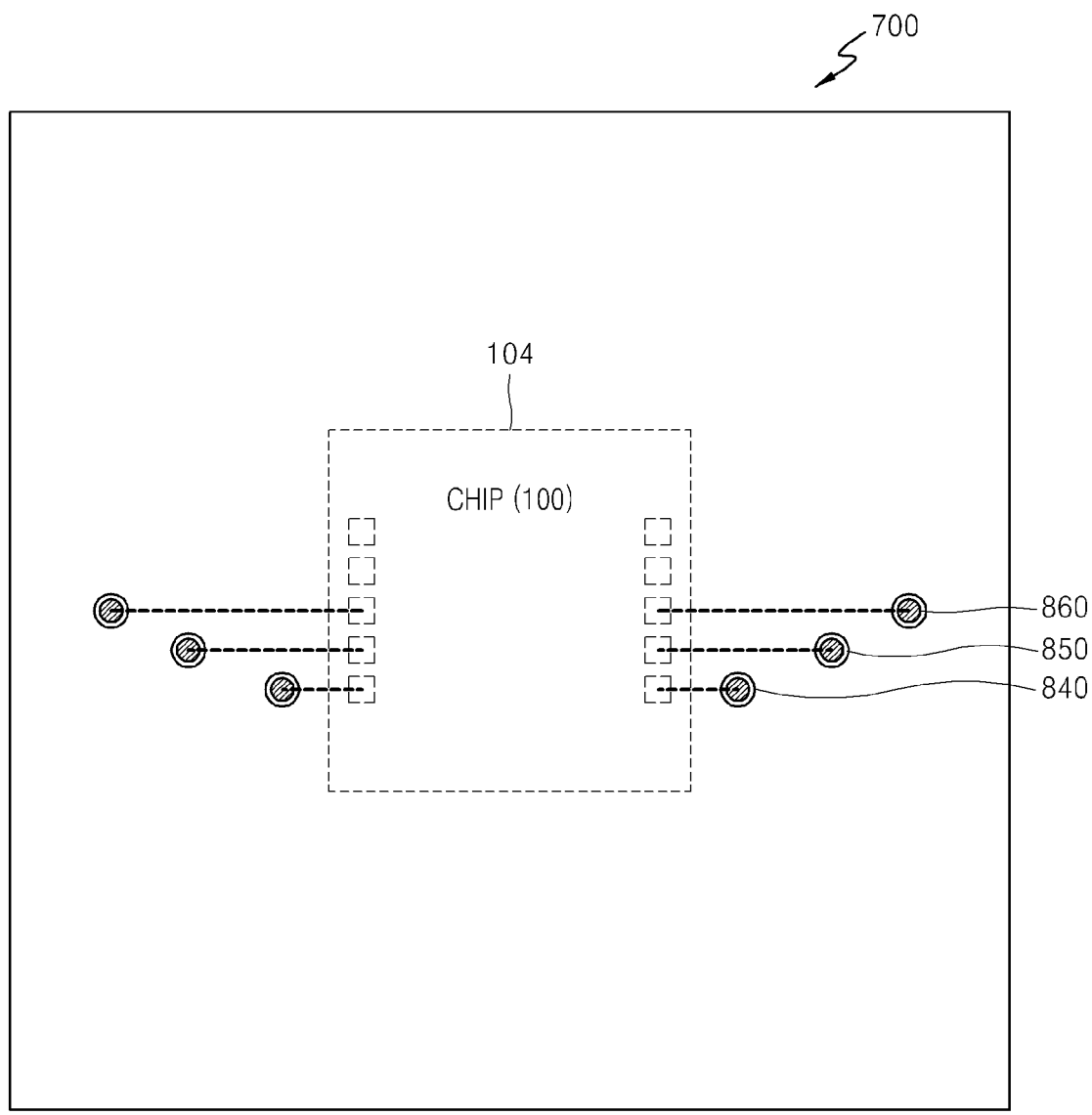
FIG. 9A is a plan view of an underside of the substrate of FIG. 4A, following application of the solder ball pads, in accordance with another embodiment of the present inventive concepts.
Figure 9B:
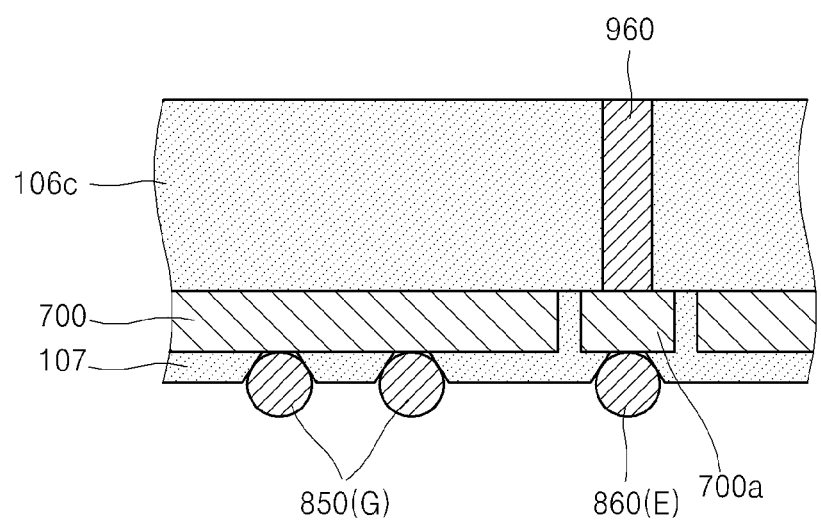
FIG. 9B is a close-up cross-sectional view of the fourth conductive layer and solder ball pads, in accordance with another embodiment of the present inventive concepts.

FIG. 9A is a plan view of an underside of the substrate 200 of FIG. 4A, following application of the package lead pads 840, 850, 860, in accordance with another embodiment of the present inventive concepts. FIG. 9B is a close-up cross-sectional view of the fourth conductive layer 700 and solder ball pads, in accordance with another embodiment of the present inventive concepts. It can be seen in this view that the second package leads 860 (E) may be in contact with a package lead pad 700a, which is a portion of the fourth conductive layer 700, and is further connected with the second vertical interconnect 960 and insulated from the fourth conductive layer 700. A lower surface of the second vertical interconnect 960 may contact with the second package leads 860 (E) directly, while being insulated from the fourth conductive layer 700 by a portion of the insulative region 106c. Also, it can be seen that the lower surface of the fourth conductive layer 700 makes contact with the third package leads 850 (G). The package leads 840, 850, 860 are insulated from each other by a layer of solder resist 107 provided on an under surface of the substrate 200.

Figure 10A:
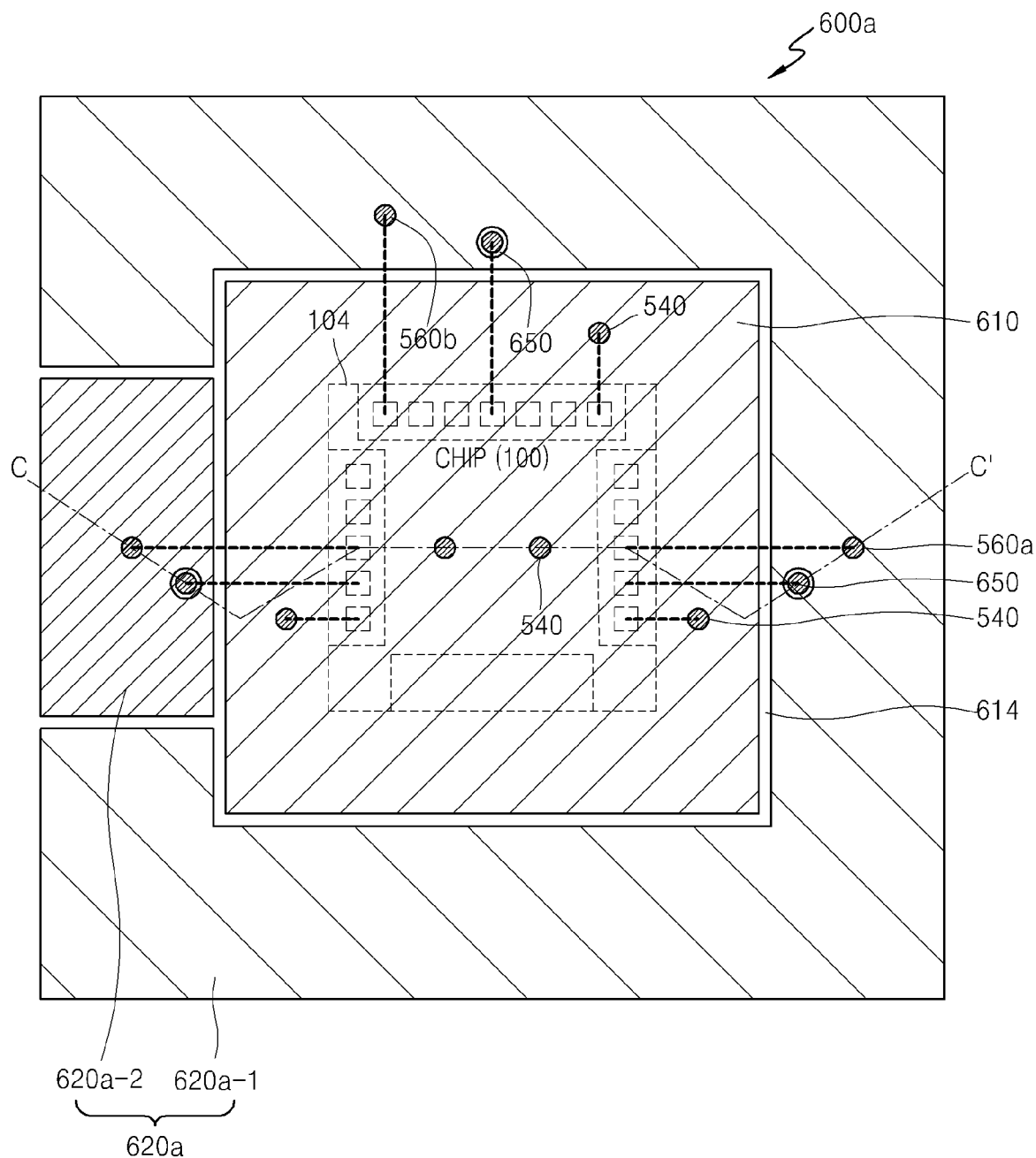
FIG. 10A is a plan view of the third conductive layer of the embodiment of the substrate of FIG. 4A, in accordance with an alternative embodiment of the present inventive concepts.
Figure 10B:
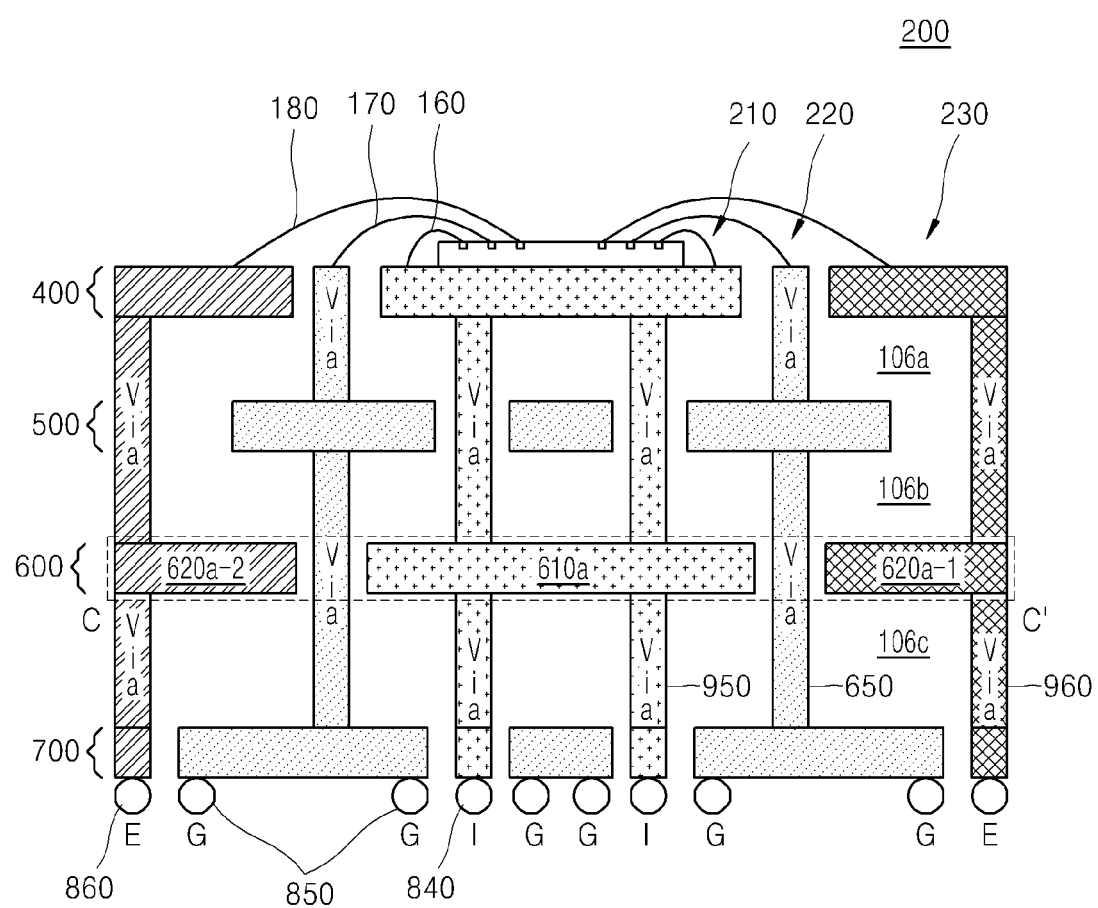
FIG. 10B is a close-up cross-sectional illustration of the substrate configuration of FIG. 10A, taken along section line C-C' of FIG. 10A.

FIG. 10A is a plan view of the third conductive layer 600 of the embodiment of the substrate 200 of FIG. 4A, in accordance with an alternative embodiment of the present inventive concepts. FIG. 10B is a close-up cross-sectional illustration of the substrate configuration of FIG. 10A, taken along section line C-C' of FIG. 10A. In this embodiment, it can be seen that the third conductive layer 600a comprises a first inner region 610a and a second inner region 620a in turn comprising conductive planes that are insulated from each other by insulative region 614, as in the embodiment of the third conductive layer 600 described above in connection with FIG. 7. However, in the present embodiment, it can also be seen that the second inner region 620a includes a first portion 620a-1 and a second portion 620a-2 that are electrically insulated from each other. This embodiment is particularly amenable to applications where different voltage levels are required by different circuit blocks of the chip 100. For example, the chip 100 may require a first external voltage level VDDE-1 for a first block of the chip 100 and may require a second voltage level VDDE-2 for a second block of the chip 100. The first external voltage level VDDE-1 can be applied to chip bonding pads connected to the first portion 620*a*-1 of the second inner region 620*a* and the second external voltage level VDDE-2 can be applied to chip bonding pads connected to the second portion 620*a*-2 of the second inner region 620*a*. The substrate bonding pads can be connected to the first and second portions 620*a*-1, 620*a*-2 of the second inner region of the third conductive layer 600, and to corresponding regions of the first conductive layer 400 in the manner described herein.

Figure 11B:
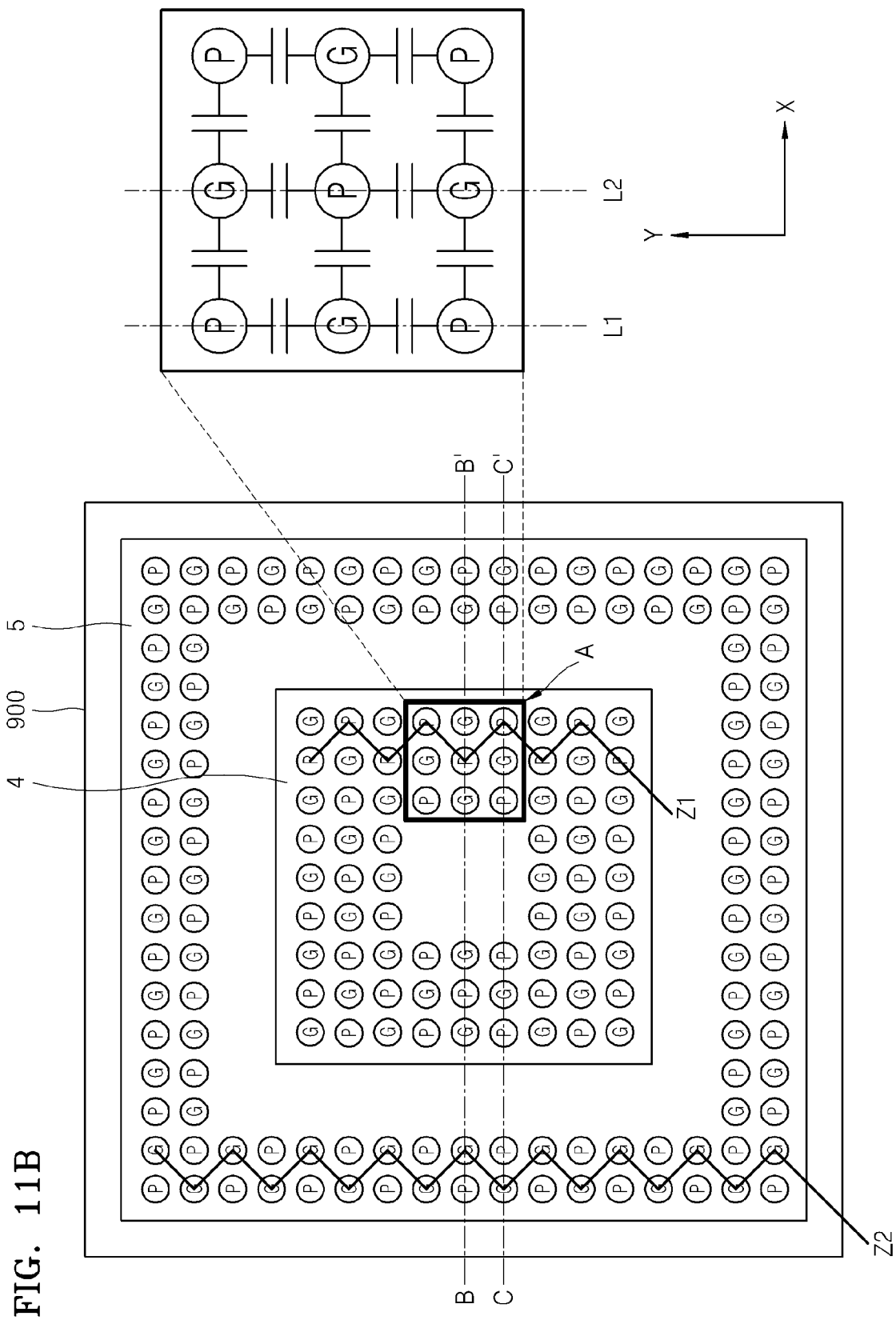

FIG. 11A-11D illustrate various embodiments of the package lead pad matrix 900, in accordance with the present inventive concepts. The embodiments shown include a linear matrix and a zig-zag matrix. Referring to FIGS. 1 and 11A, the package lead pads include power package lead pads (P) for the first package leads 840 or the second package leads 860, and ground package lead pads (G) for the third package leads 850. A plurality of capacitors can be formed between the power package leads (P) and the ground package leads (G).

FIG. 11A is a plan view of an underside of the substrate 200, illustrating an embodiment of a linear matrix of the package lead pads of the substrate, in accordance with an embodiment of the present inventive concepts. As shown in close up portion "A" of FIG. 11A, a capacitor can be formed between neighboring power package lead pads (P) and ground package lead pads (G). The power package lead pads (P) are linearly arranged in a first line "L1" in the Y-axis direction and the ground package lead pads (G) are linearly arranged in a second line "L2" in the X-axis direction. The first and second lines L1, L2 are arranged alternately in the X-axis direction. The resulting capacitors can be considered to be coupled in series in the X-axis and Y-axis directions.

In an embodiment, the package lead pads matrix comprises an inner portion 4 and outer portion 5 surrounding the inner portion. The power package lead pads (P) for the first package leads 840 and the second package leads 860 may be disposed in the inner portion 4.

Figure 11C:
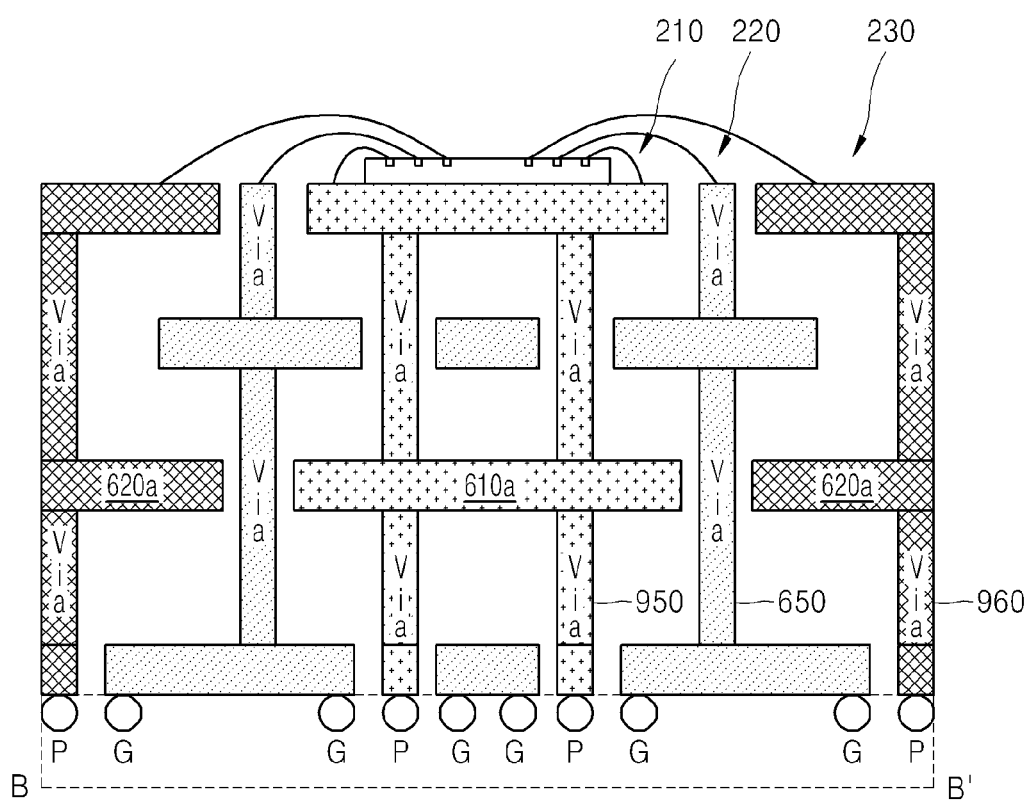
Figure 11D:
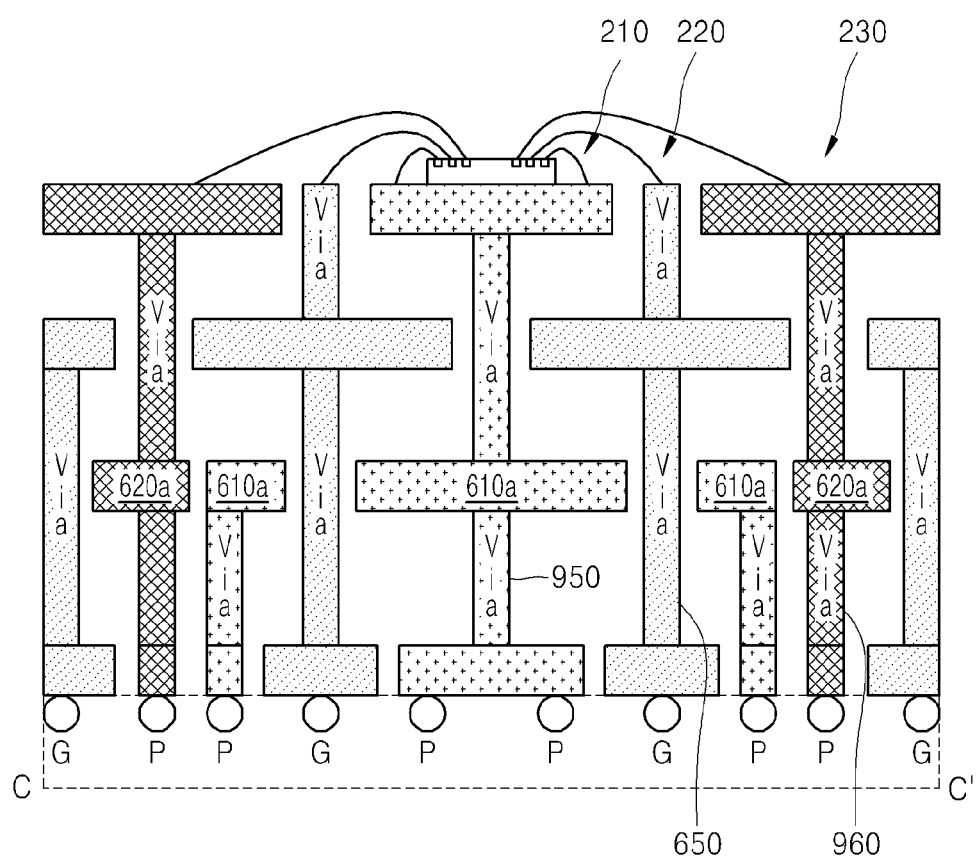

FIG. 11B is plan view of an underside of the substrate 200, illustrating an embodiment of a zig-zag matrix of the package lead pads of the substrate, in accordance with an embodiment of the present inventive concepts. FIG. 11C is a cross-sectional view of the substrate, taken across section line B-B' of FIG. 11B. FIG. 11D is a cross-sectional view of the substrate, taken across section line C-C' of FIG. 11B. As shown in close up portion of "A" of FIG. 11B, capacitors can be formed between the power package lead pads (P) and a ground package lead pads (G). The power package lead pads (P) are arranged in a linear direction along the Y-axis direction with offset between a first line "L1" and a second line "L2". The ground package lead pads (G) are arranged in a linear direction along the Y-axis direction with offset in a first line L1 and a second line L2. The first and second lines L1, L2 are arranged alternately in the X-axis direction. As a result, in the inner portion 4, the power package lead pads (P) and the ground package lead pads (G) are alternately offset and are arranged in a first zig-zag line Z1. Similarly, in the outer portion 5, the power package lead pads (P) and the ground package lead pads (G) are alternately offset and are arranged in a second zig-zag line Z2. The resulting capacitor that are formed between them are also coupled in the X-axis direction and in the Y-axis direction as shown. The power package lead pads (P) and the ground package lead pads (G) are arranged alternately, so capacitance formed between the first or second package leads 840, 860 and the third package leads 850 can be increased. In other embodiments, a linear package lead pad matrix and a zig-zag package lead pad matrix can be combined in the same package lead pad matrix. For example, the package lead pad matrix may includes a linear matrix in the inner portion and a zig-zag matrix in the outer portion, or, alternatively, a linear matrix in the outer portion and a zig-zag matrix in the inner portion.

Although the examples illustrated and described above depict a four-layered substrate 200, embodiments of the present inventive concepts are applicable to substrates having more than four layers or fewer than four layers.

Figure 12:
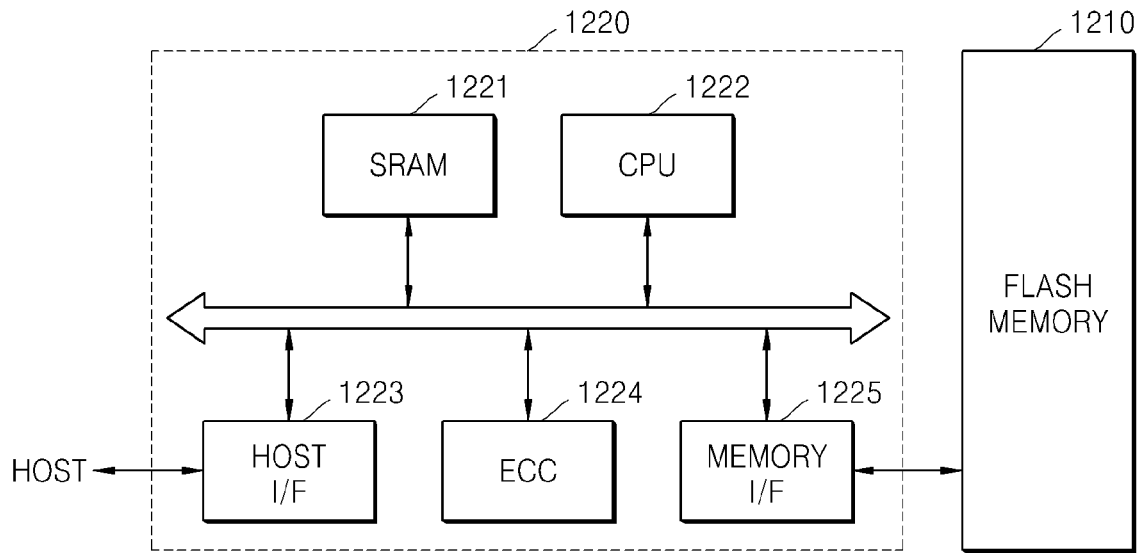
FIG. 12 is a block diagram of a memory card that comprises a semiconductor device in accordance with the embodiments of the present invention.

FIG. 12 is a block diagram of a memory card 1200 that comprises a semiconductor device in accordance with the embodiments of the present invention. The memory card 1200 comprises a memory controller 1220 that generates command and address signals C/A and a memory module 1210 for example, flash memory 1210 that comprises one or a plurality of flash memory devices. The memory controller 1220 comprises a host interface 1223 that transmits and receives command and address signals to and from a host, a controller 1224, and a memory interface 1225 that in turn transmits and receives the command and address signals to and from the memory module 1210. The host interface 1223, the controller 1224 and memory interface 1225 communicate with controller memory 1221 and processor 1222 via a common bus.

The memory module 1210 receives the command and address signals C/A from the memory controller 1220, and, in response, stores and retrieves data DATA I/O to and from at least one of the memory devices on the memory module 1210. Each memory device comprises a plurality of addressable memory cells and a decoder that receives the receives the command and address signals, and that generates a row signal and a column signal for accessing at least one of the addressable memory cells during programming and read operations.

Each of the components of the memory card 1200, including the memory controller 1220, electronics 1221, 1222, 1223, 1224, and 1225 comprised on the memory controller 1220 and the memory module 1210 can employ packaged devices that have power configurations and layouts that are in accordance with the inventive concepts disclosed herein.

Figure 13:
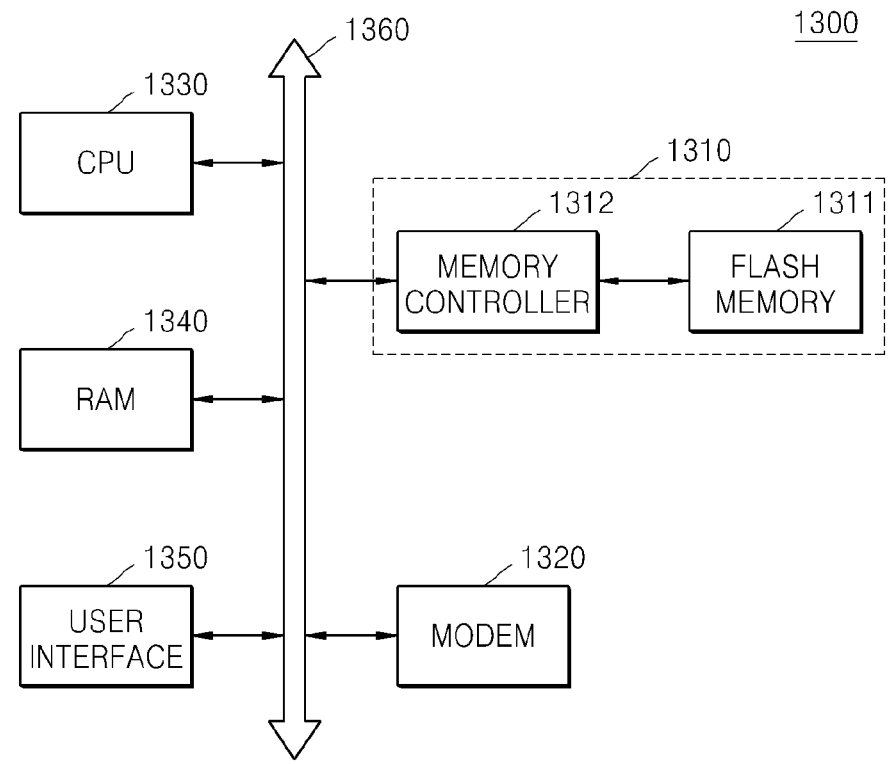
FIG. 13 is a block diagram of a memory system that employs a memory module, for example, of the type described herein.

FIG. 13 is a block diagram of a memory system 1300 that employs a memory module 1310, for example, of the type described herein. The memory system 1300 comprises a processor 1330, random access memory 1340, user interface 1350 and modem 1320 that communicate via a common bus 1360. The devices on the bus 1360 transmit signals to and receive signals from the memory card 1310 via the bus 1360. Each of the components of the memory system 1300, including the processor 1330, random access memory 1340, user interface 1350 and modem 1320 along with the memory card 1310 can employ packaged devices of the type disclosed herein. The memory system 1300 can find application in any of a number of electronic applications, for example, those found in consumer electronic devices such as solid state disks (SSD), camera image sensors (CIS) and computer application chip sets.

The memory systems and devices disclosed herein can be packaged in any of a number of device package types, including, but not limited to, ball grid arrays (BGA), chip scale packages (CSP), plastic leaded chip carrier (PLCC) plastic dual in-line package (PDIP), multi-chip package (MCP), wafer-level fabricated package (WFP), and wafer-level processed stock package (WSP).

While embodiments of the inventive concepts have been particularly shown and described with references to preferred embodiments thereof, it will be understood by those skilled in the art that various changes in form and details may be made herein without departing from the spirit and scope of the inventive concept as defined by the appended claims.

What is claimed is:

1. A semiconductor chip carrier, comprising:
multiple conductive layers separated from each other by dielectric layers, the multiple conductive layers comprising:
a first conductive layer;
a second conductive layer directly adjacent the first conductive layer; and
a third conductive layer directly adjacent to the second conductive layer,
wherein the first conductive layer is a power plane, the second conductive layer is a ground plane and the third conductive layer is a power plane;
a center position at an intermediate portion of a top surface of the semiconductor chip carrier; and
a bonding region spaced apart from the center position, the bonding region being positioned on the first conductive layer, the bonding region comprising:
a first bonding region closest to the center position;
a second bonding region most distant from the center position; and
a third bonding region positioned between the first bonding region and the second bonding region;
wherein the first bonding region, the second bonding region and the third bonding region are electrically insulated from each other and wherein the first bonding region is configured to carry a first voltage, the second bonding region is configured to carry a second voltage and the third bonding region is configured to carry a third voltage that is less than the first voltage and less than the second voltage, the first voltage being a first power voltage and the second voltage being a second power voltage;
wherein a lowermost conductive layer of the multiple conductive layers comprises a plurality of package lead bonding regions, and
wherein the plurality of package lead bonding regions are within the bonding region.

2. The semiconductor chip carrier of claim 1 wherein the first voltage comprises an internal voltage level, wherein the second voltage comprises an external voltage level, and wherein the third voltage comprises a ground reference level.

3. The semiconductor chip carrier of claim 1:
wherein the second conductive layer neighboring the first conductive layer in a vertical direction of the chip carrier comprises a conductive plane that is configured to carry the third voltage; and
wherein the third conductive layer neighboring the second conductive layer opposite the first conductive layer in the vertical direction comprises a conductive plane that is configured to carry at least one of the first and second voltages.

4. The semiconductor chip carrier of claim 3 further comprising first conductive vias that pass through the second conductive layer and are electrically insulated from the second conductive layer that are configured to carry at least one of the first voltage and the second voltage from the third conductive layer to the first conductive layer.

5. The semiconductor chip carrier of claim 3 wherein a fourth conductive layer neighboring the third conductive layer opposite the second conductive layer in the vertical direction comprises a conductive plane that is configured to carry the third voltage.

6. The semiconductor chip carrier of claim 5 further comprising second conductive vias that pass through the third conductive layer and are electrically insulated from the third conductive layer that are configured to carry the third voltage from the fourth conductive layer to the second conductive layer.

7. The semiconductor chip carrier of claim 6 wherein the fourth conductive layer comprises the lowermost conductive layer of the multiple conductive layers.

8. The semiconductor chip carrier of claim 3 wherein the second conductive layer comprises first and second portions that are electrically insulated from each other, and wherein the first portion is configured to carry the third voltage and wherein the second portion is configured to carry a fourth voltage, wherein the third voltage is less than the fourth voltage.

9. The semiconductor chip carrier of claim 1 further comprising a plurality of signal bonding regions positioned on the upper conductive layer, the signal bonding regions being more distant from the chip bonding position than the second bonding region.

10. The semiconductor chip carrier of claim 1 further comprising a wire-bond-type semiconductor chip mounted at the center position and further comprising:
first bonding wires connecting first chip bonding pads of the semiconductor chip to the first bonding region;
second bonding wires connecting second chip bonding pads of the semiconductor chip to the second bonding region; and
third bonding wires connecting third chip bonding pads of the semiconductor chip to the third bonding region;
wherein the third bonding wires are positioned between the first bonding wires and the second bonding wires.

11. The semiconductor chip carrier of claim 10 wherein the third bonding wires operate as a signal interference shield between the first voltage present on the first bonding wires and the second voltage present on the second bonding wires.

12. The semiconductor chip carrier of claim 1 wherein:
a first set of the package lead bonding regions are coupled to the first bonding region;
a second set of the package lead bonding regions are coupled to the second bonding region;
a third set of the package lead bonding regions are coupled to the third bonding region;
the third set of the package lead bonding regions are positioned between the first set of the package lead bonding regions and the second set of the package lead bonding regions.

13. The semiconductor chip carrier of claim 1 wherein the first bonding region covers the center position so that an underside of a chip mounted to the semiconductor chip carrier makes electrical contact with the first bonding region.

14. The semiconductor chip carrier of claim 1 wherein at least one of the first bonding region, the second bonding region and the third bonding region has an exposed upper surface that comprises a conductive ring that surrounds the chip bonding position.

15. The semiconductor chip carrier of claim 1 wherein at least one of the first bonding region, the second bonding region and the third bonding region is recessed relative to the top surface of the semiconductor chip carrier.

16. The semiconductor chip carrier of claim 1 wherein at least one of the first bonding region, the second bonding region and the third bonding region has a top surface that comprises a segmented conductive ring that surrounds the center position.

17. The semiconductor chip carrier of claim 1 wherein at least one of the first bonding region, the second bonding region and the third bonding region has a top surface that comprises a conductive segment that lies at one or more sides of the chip bonding position, but does not surround the center position.

18. The semiconductor chip carrier of claim 1 wherein at least one of the first bonding region, the second bonding region and the third bonding region has a top surface that comprises discrete conductive segments that each provide a single bonding location for bonding a chip to the semiconductor chip carrier.

19. The semiconductor chip carrier of claim 18 wherein the discrete conductive segments of the at least one bonding region include a first set of conductive segments and a second set of conductive segments, that are horizontally offset from each other, relative to the center position.

20. The semiconductor chip carrier of claim 1 wherein at least one of the first bonding region, the second bonding region and the third bonding region extends in a linear direction.

21. The semiconductor chip carrier of claim 1 wherein at least one of the first bonding region, the second bonding region and the third bonding region extends along a curved direction.

22. The semiconductor chip carrier of claim 1 wherein a capacitance is created between the first conductive and the second conductive layer and a capacitance is created between the second conductive layer and the third conductive layer.

23. The semiconductor chip carrier of claim 1 further comprising a plurality of package leads connected to the plurality of package lead bonding regions, the plurality of package leads comprising:
 a first package lead for transmitting a power voltage;
 a second package lead for transmitting a ground voltage; and
 a third package lead for transmitting a power voltage,
 wherein the second package lead is disposed between the first package lead and the third package lead.

24. A semiconductor chip carrier comprising:
 multiple conductive layers separated from each other by dielectric layers, the multiple conductive layers comprising:
  a first conductive layer having a center position and bonding regions, wherein the first conductive layer comprises a power plane, the bonding regions comprising a first bonding region, a second bonding region, and a third bonding region electrically insulated from each other;
   wherein the first bonding region is closest in proximity among the bonding regions to a center of the center position, the second bonding region is more distant from the center position than the first bonding region, and the third bonding region is more distant from the center position than the second bonding region; and
   wherein the first bonding region is configured to carry a first voltage, the second bonding region is configured to carry a second voltage, and the third bonding region is configured to carry a third voltage, the first voltage being a first power voltage and the third voltage being a second power voltage;
  a second conductive layer directly adjacent the first conductive layer in a vertical direction of the chip carrier, the second conductive layer configured to carry the second voltage, wherein the second conductive layer comprises a ground plane;
  a third conductive layer directly adjacent the second conductive layer opposite the first conductive layer in the vertical direction, the third conductive layer configured to carry the third voltage, wherein the third conductive layer comprises a power plane; and
 a fourth conductive layer neighboring the third conductive layer opposite the second conductive layer in the vertical direction, the fourth conductive layer configured to carry the second voltage,
 wherein a lowermost conductive layer of the multiple conductive layers comprises a plurality of package lead bonding regions, and
 wherein the plurality of package lead bonding regions are within the bonding region.

25. The semiconductor chip carrier of claim 24, wherein the second voltage is a ground voltage.

26. The semiconductor chip carrier of claim 24:
 wherein the fourth conductive layer is the lowermost conductive layer of the multiple conductive layers, and wherein the fourth conductive layer further comprises lead pads comprising a first lead pad, a second lead pad, and a third lead pad electrically insulated from each other;
 wherein the first lead pad is closest in proximity among the lead pads to a corresponding position on the fourth conductive layer that corresponds, in the vertical direction, to the center position of the first conductive layer, the second lead pad is more distant from the corresponding position on the fourth conductive layer than the first lead pad, and the third lead pad is more distant from the corresponding position on the fourth conductive layer than the second lead pad; and
 wherein the first lead pad is configured to carry the first voltage, the second lead pad is configured to carry the second voltage, and the third lead pad is configured to carry the third voltage.

* * * * *